(12) United States Patent
Chi et al.

(10) Patent No.: US 11,450,588 B2
(45) Date of Patent: Sep. 20, 2022

(54) METHOD FOR FORMING CHIP PACKAGE STRUCTURE WITH HEAT CONDUCTIVE LAYER

(71) Applicant: Taiwan Semiconductor Manufacturing Co., Ltd., Hsinchu (TW)

(72) Inventors: Shin Chi, Hsinchu County (TW); Chien-Hao Hsu, Hsinchu County (TW); Kuo-Chin Chang, Chiayi (TW); Cheng-Nan Lin, Hsinchu (TW); Mirng-Ji Lii, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 48 days.

(21) Appl. No.: 16/654,198

(22) Filed: Oct. 16, 2019

(65) Prior Publication Data
US 2021/0118767 A1    Apr. 22, 2021

(51) Int. Cl.
*H01L 23/373*    (2006.01)
*H01L 21/56*    (2006.01)
(Continued)

(52) U.S. Cl.
CPC ........ *H01L 23/3735* (2013.01); *H01L 21/563* (2013.01); *H01L 21/76877* (2013.01); *H01L 24/14* (2013.01); *H01L 24/29* (2013.01)

(58) Field of Classification Search
CPC ......... H01L 24/14; H01L 24/29; H01L 24/33; H01L 24/32; H01L 24/16; H01L 24/73;
(Continued)

(56) References Cited

U.S. PATENT DOCUMENTS 10,515,887 B2 * 12/2019 Syu ..................... H01L 23/3675
10,566,313 B1 *  2/2020 Li ........................ H01L 23/3735
(Continued)

FOREIGN PATENT DOCUMENTS

CA    2676495 A1    2/2011
CN    102668075 A    9/2012

OTHER PUBLICATIONS

Chinese Language Office Action dated Apr. 30, 2021 issued in TW application No. 109135895.

*Primary Examiner* — Nilufa Rahim
(74) *Attorney, Agent, or Firm* — McClure, Qualey & Rodack, LLP

(57) ABSTRACT

A method for forming a chip package structure is provided. The method includes disposing a chip over a substrate. The method includes forming a heat-spreading wall structure over the substrate. The heat-spreading wall structure is adjacent to the chip, and there is a first gap between the chip and the heat-spreading wall structure. The method includes forming a first heat conductive layer in the first gap. The method includes forming a second heat conductive layer over the chip. The method includes disposing a heat-spreading lid over the substrate to cover the heat-spreading wall structure, the first heat conductive layer, the second heat conductive layer, and the chip. The heat-spreading lid is bonded to the substrate, the heat-spreading wall structure, the first heat conductive layer, and the second heat conductive layer.

20 Claims, 22 Drawing Sheets

(51) Int. Cl.
*H01L 21/768* (2006.01)
*H01L 23/00* (2006.01)

(58) Field of Classification Search
CPC . H01L 2224/29109; H01L 2224/29144; H01L 2224/29155; H01L 2224/29172; H01L 24/27; H01L 24/83; H01L 24/13; H01L 2224/13111; H01L 2224/16225; H01L 2224/29166; H01L 2224/2919; H01L 2224/32013; H01L 2224/32014; H01L 2224/32225; H01L 2224/33181; H01L 2224/73204; H01L 2224/73253; H01L 2224/81424; H01L 2224/81439; H01L 2224/81444; H01L 2224/81447; H01L 2224/81484; H01L 2224/83007; H01L 2224/83409; H01L 2224/83411; H01L 2224/83439; H01L 2224/83444; H01L 2224/8359; H01L 2224/83693; H01L 2224/83951; H01L 2224/92225; H01L 2924/16152; H01L 2924/1715; H01L 23/367; H01L 23/3737; H01L 23/42; H01L 23/433; H01L 23/3677; H01L 23/3735; H01L 21/563; H01L 21/76877

See application file for complete search history.

(56) References Cited

U.S. PATENT DOCUMENTS

| | | | |
|---|---|---|---|
| 2010/0078791 A1* | 4/2010 | Yim | H01L 25/0655 257/686 |
| 2011/0042784 A1* | 2/2011 | Edwards | H01L 23/293 257/532 |
| 2015/0001701 A1* | 1/2015 | Li | H01L 23/3737 257/713 |
| 2019/0318994 A1* | 10/2019 | Kweon | H01L 24/20 |
| 2020/0020606 A1* | 1/2020 | Kim | H01L 23/3735 |
| 2020/0266172 A1* | 8/2020 | Nishimura | H01L 23/49811 |
| 2021/0035859 A1* | 2/2021 | Mehta | H01L 21/56 |

* cited by examiner

METHOD FOR FORMING CHIP PACKAGE STRUCTURE WITH HEAT CONDUCTIVE LAYER

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using photolithography processes and etching processes to form circuit components and elements.

Dozens or hundreds of integrated circuits are typically manufactured on a single semiconductor wafer. The individual dies are singulated by sawing the integrated circuits along scribe lines. The individual dies are then packaged separately. The semiconductor industry continues to improve the integration density of various electronic components (e.g., transistors, diodes, resistors, capacitors, etc.) by continual reductions in minimum feature size, which allow more components to be integrated into a given area. However, since feature sizes continue to decrease, fabrication processes continue to become more difficult to perform. Therefore, it is a challenge to form reliable packages with electronic components with high integration density.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1B-1 is a top view of the chip package structure of FIG. 1B, in accordance with some embodiments.

FIG. 1C-1 is a top view of the chip package structure of FIG. 1C, in accordance with some embodiments.

FIG. 1D-1 is a top view of the chip package structure of FIG. 1D, in accordance with some embodiments.

FIG. 1E-1 is a top view of the chip package structure of FIG. 1E, in accordance with some embodiments.

DETAILED DESCRIPTION

Figure 1A:
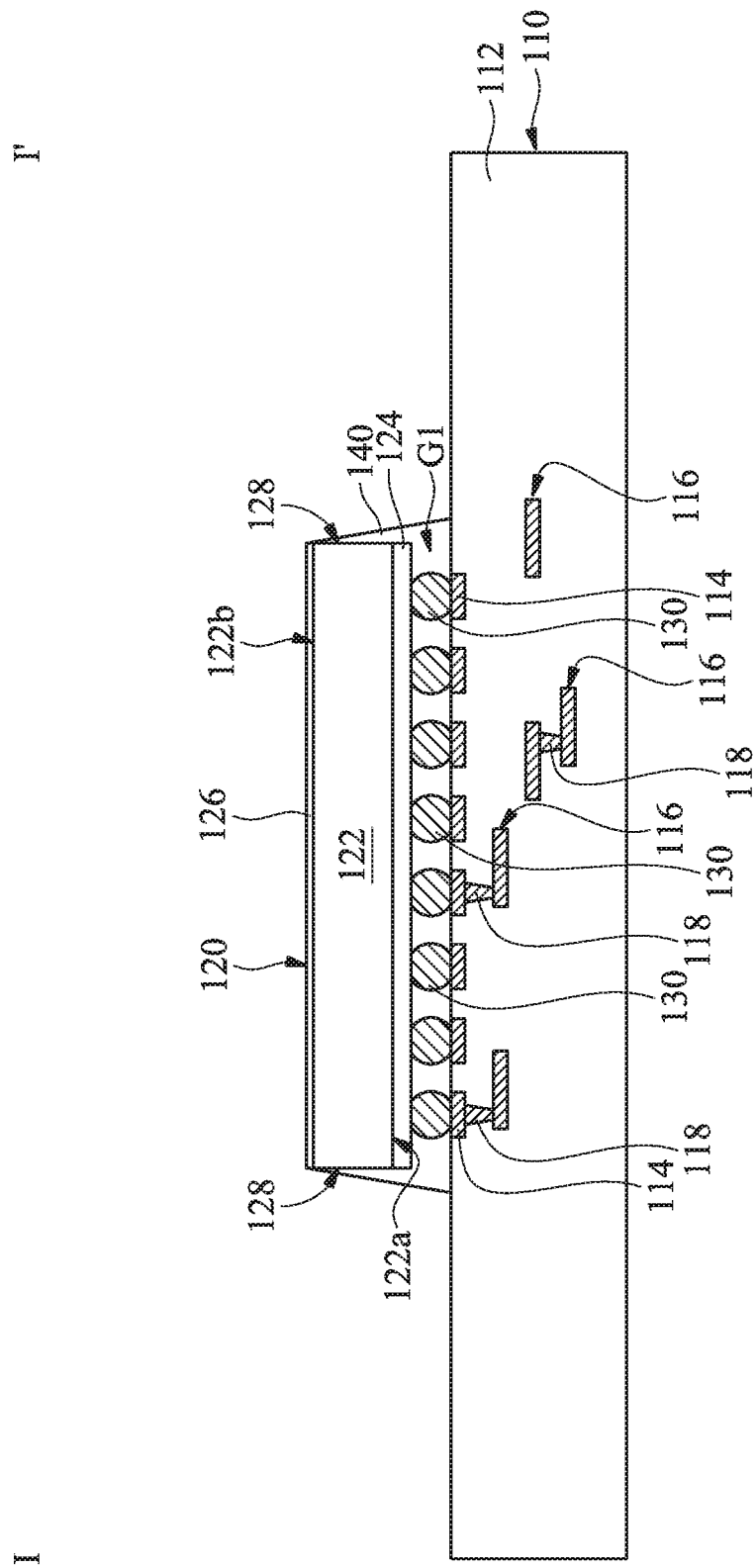
FIGS. 1A-1E are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1E are cross-sectional views of various stages of a process for forming a chip package structure, in accordance with some embodiments. As shown in FIG. 1A, a substrate 110 is provided, in accordance with some embodiments. The substrate 110 includes a printed circuit board (PCB), a chip, or another suitable structure with wiring layers and pads.

The substrate 110 includes a dielectric layer 112, conductive pads 114, wiring layers 116, and conductive vias 118, in accordance with some embodiments. The conductive pads 114 are formed over the dielectric layer 112, in accordance with some embodiments.

The wiring layers 116 and the conductive vias 118 are formed in the dielectric layer 112, in accordance with some embodiments. The conductive vias 118, the wiring layers 116, and the conductive pads 114 are electrically connected to each other, in accordance with some embodiments.

The dielectric layer 112 is made of an insulating material, such as oxides, e.g., silicon oxide ($SiO_2$), in accordance with some embodiments. The conductive pads 114, the wiring layers 116, and the conductive vias 118 are made of metal (e.g., copper, aluminum, gold, silver, or tungsten) or alloy thereof, in accordance with some embodiments.

As shown in FIG. 1A, a chip 120 is provided, in accordance with some embodiments. The chip 120 includes a substrate 122, a redistribution layer 124, and an interfacial layer 126, in accordance with some embodiments. The substrate 122 has a front surface 122a and a back surface 122b, in accordance with some embodiments.

The substrate 122 includes, for example, a semiconductor substrate. In some embodiments, the substrate 122 is made of an elementary semiconductor material including silicon or germanium in a single crystal, polycrystal, or amorphous structure.

In some other embodiments, the substrate 122 is made of a compound semiconductor, such as silicon carbide, gallium arsenide, gallium phosphide, indium phosphide, indium arsenide, an alloy semiconductor, such as SiGe, or GaAsP, or a combination thereof. The substrate 122 may also include multi-layer semiconductors, semiconductor on insulator (SOI) (such as silicon on insulator or germanium on insulator), or a combination thereof.

In some embodiments, the substrate 122 includes various device elements. In some embodiments, the various device elements are formed in and/or over the substrate 122. The device elements are not shown in figures for the purpose of simplicity and clarity. Examples of the various devices include active devices, passive devices, other suitable devices, or a combination thereof. The active devices may include transistors or diodes (not shown) formed at the front surface 122a. The passive devices include resistors, capacitors, or other suitable passive devices.

For example, the transistors include metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 122. The isolation features are used to define active regions and electrically isolate various device elements formed in and/or over the substrate 122 in the active regions. In some embodiments, the isolation features include shallow trench isolation (STI) features, local oxidation of silicon (LOCOS) features, other suitable isolation features, or a combination thereof.

The redistribution layer 124 is formed over the front surface 122a, in accordance with some embodiments. The redistribution layer 124 includes a dielectric layer (not shown) and wiring layers (not shown) in the dielectric layer, in accordance with some embodiments. The wiring layers are electrically connected to devices (not shown) formed at the front surface 122a, in accordance with some embodiments.

The interfacial layer 126 is formed over the back surface 122b of the substrate 122, in accordance with some embodiments. The interfacial layer 126 includes a titanium layer (not shown), a nickel-vanadium (NiV) layer (not shown), and a gold layer (not shown) sequentially stacked over the back surface 122b, in accordance with some embodiments.

As shown in FIG. 1A, a chip 120 is bonded to the substrate 110 through bumps 130, in accordance with some embodiments. The bumps 130 are respectively bonded to the conductive pads 114, in accordance with some embodiments. In accordance with some embodiments, there is a gap G1 between the chip 120 and the substrate 110.

The chip 120 includes a high thermal performance chip, such as a central processing unit (CPU) chip, a server chip, a system on chip, or a high power chip. The power of the chip 120 is greater than 500 W, in accordance with some embodiments. The bumps 130 are in the gap G1, in accordance with some embodiments. The bumps 130 are made of a conductive material, such as a solder material (e.g., tin), in accordance with some embodiments.

As shown in FIG. 1A, an underfill layer 140 is formed in the gap G1, in accordance with some embodiments. The underfill layer 140 further extends onto the sidewalls 128 of the chip 120, in accordance with some embodiments. The underfill layer 140 surrounds the bumps 130, in accordance with some embodiments. The underfill layer 140 surrounds the chip 120, in accordance with some embodiments. The underfill layer 140 includes an insulating material (e.g., a polymer material), in accordance with some embodiments.

Figure 1B:
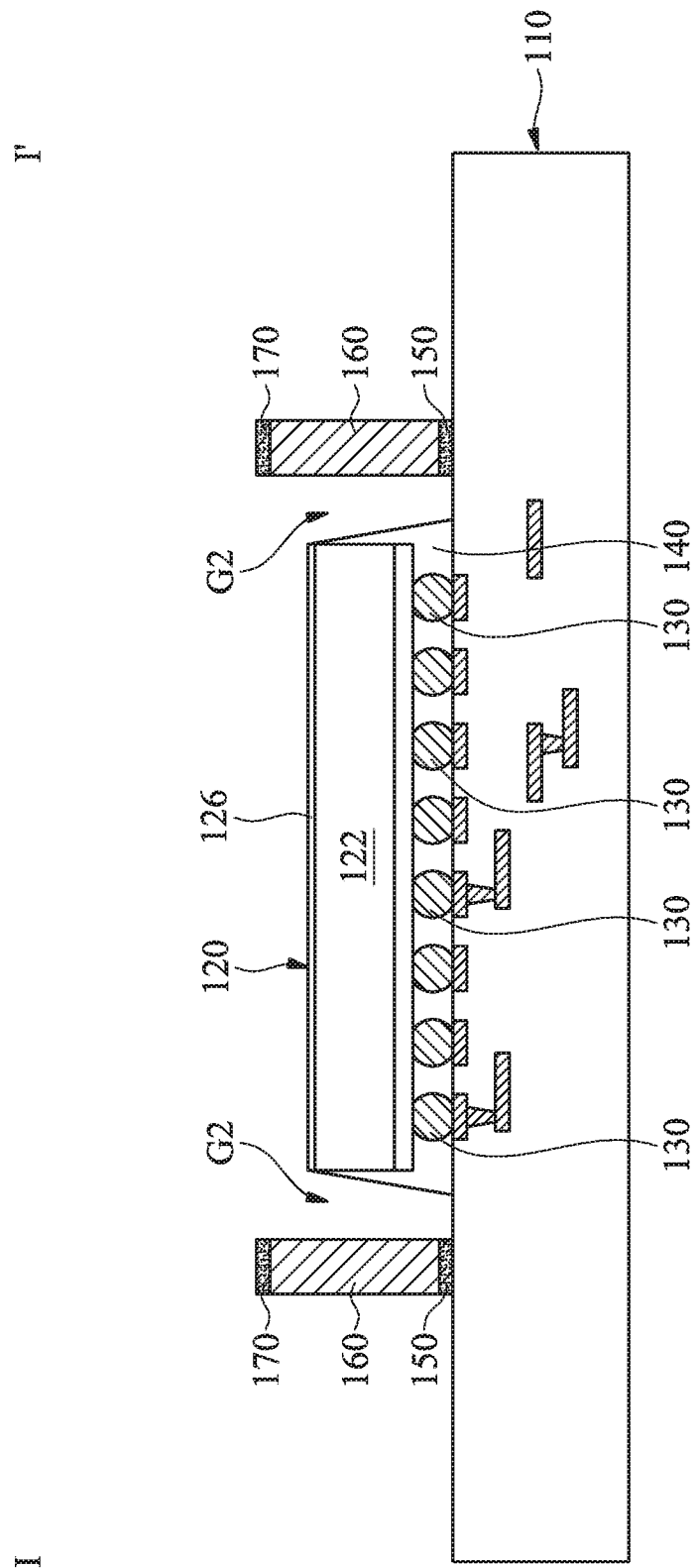
Figures 1, 1B:
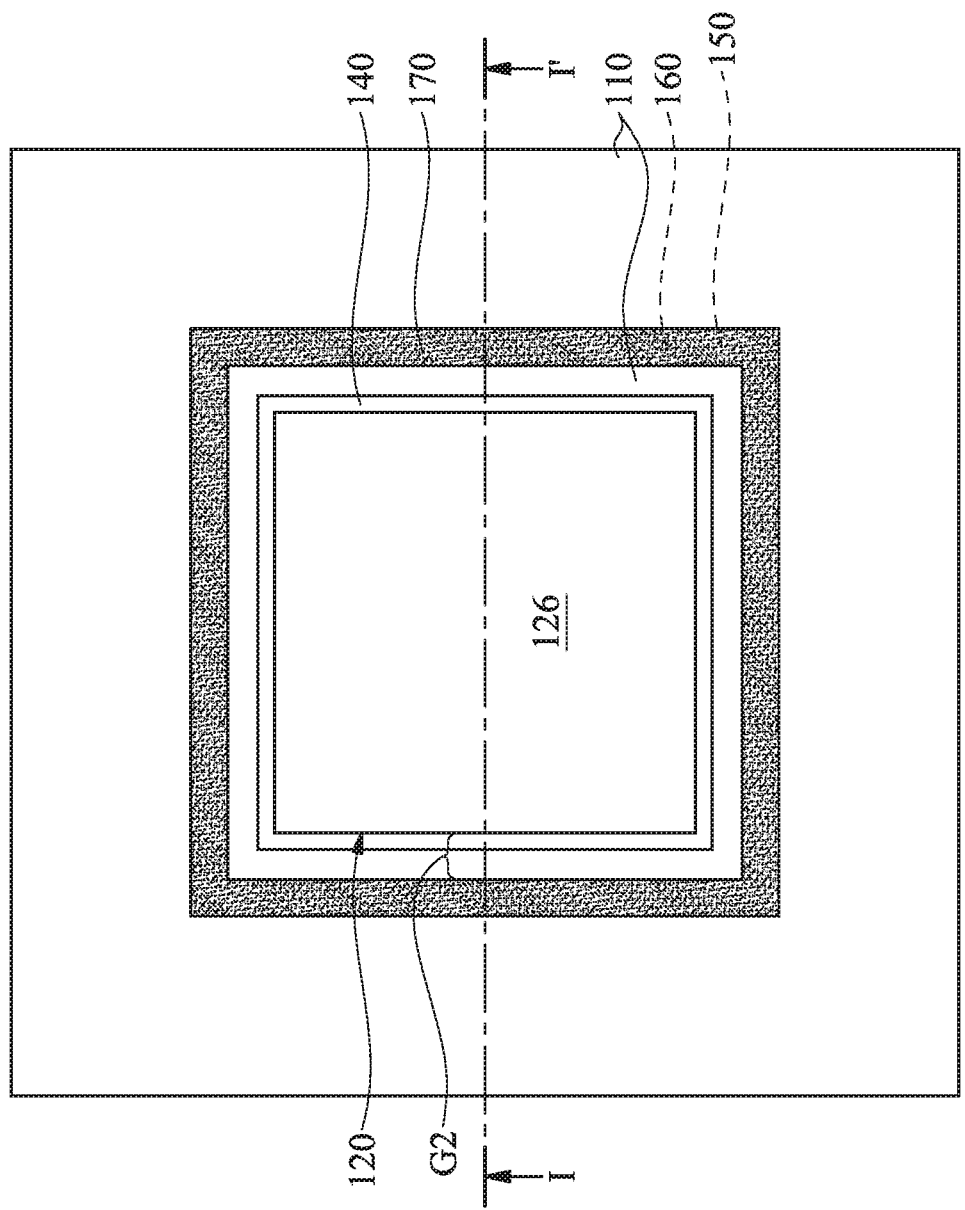

FIG. 1B-1 is a top view of the chip package structure of FIG. 1B, in accordance with some embodiments. FIG. 1B is a cross-sectional view illustrating the chip package structure along a sectional line I-I' in FIG. 1B-1, in accordance with some embodiments. As shown in FIGS. 1B and 1B-1, an adhesive layer 150 is formed over the substrate 110, in accordance with some embodiments.

The adhesive layer 150 has a ring shape, in accordance with some embodiments. The adhesive layer 150 is made of polymer, such as epoxy or silicone, in accordance with some embodiments. The adhesive layer 150 is formed using a dispensing process, in accordance with some embodiments.

As shown in FIGS. 1B and 1B-1, a heat-spreading wall structure 160 is formed over the adhesive layer 150, in accordance with some embodiments. The heat-spreading wall structure 160 is adjacent to the chip 120, in accordance with some embodiments. In accordance with some embodiments, there is a gap G2 between the chip 120 and the heat-spreading wall structure 160. The heat-spreading wall structure 160 has a ring shape, in accordance with some embodiments.

The heat-spreading wall structure 160 is made of a material with a good thermal conductivity, such as a metal material (e.g., Al, Cu and/or Ni) or an alloy material (e.g., stainless steel), in accordance with some embodiments. In some embodiments, the heat-spreading wall structure 160 is a ring structure, and the heat-spreading wall structure 160 is formed over the substrate 110 by bonding the heat-spreading wall structure 160 (or the ring structure) to the substrate 110 through the adhesive layer 150. In some embodiments, the heat-spreading wall structure 160 is formed using a plating process.

As shown in FIGS. 1B and 1B-1, an adhesive layer 170 is formed over the heat-spreading wall structure 160, in accordance with some embodiments. The adhesive layer 170 is made of polymer, such as epoxy or silicone, in accordance with some embodiments. The adhesive layer 170 is formed using a dispensing process, in accordance with some embodiments.

Figure 1C:
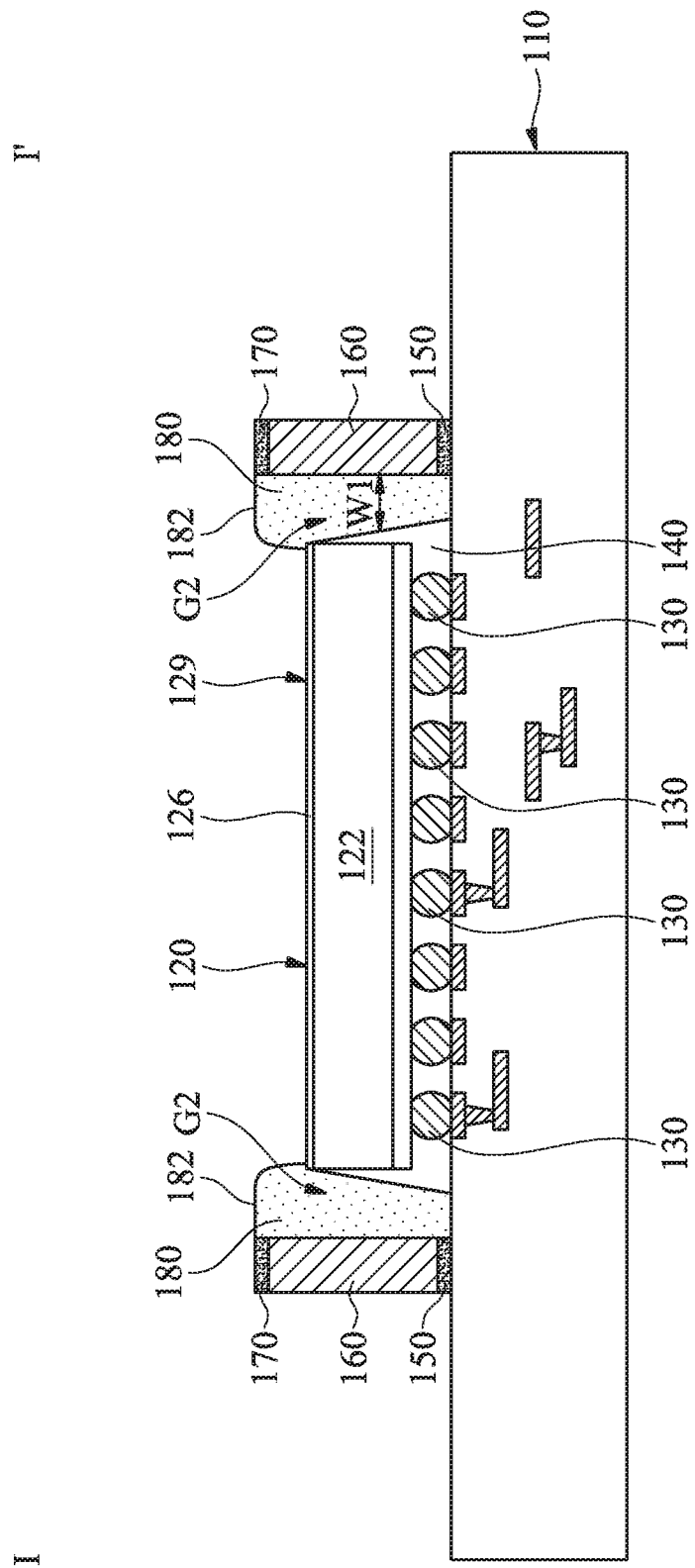
Figures 1, 1C:
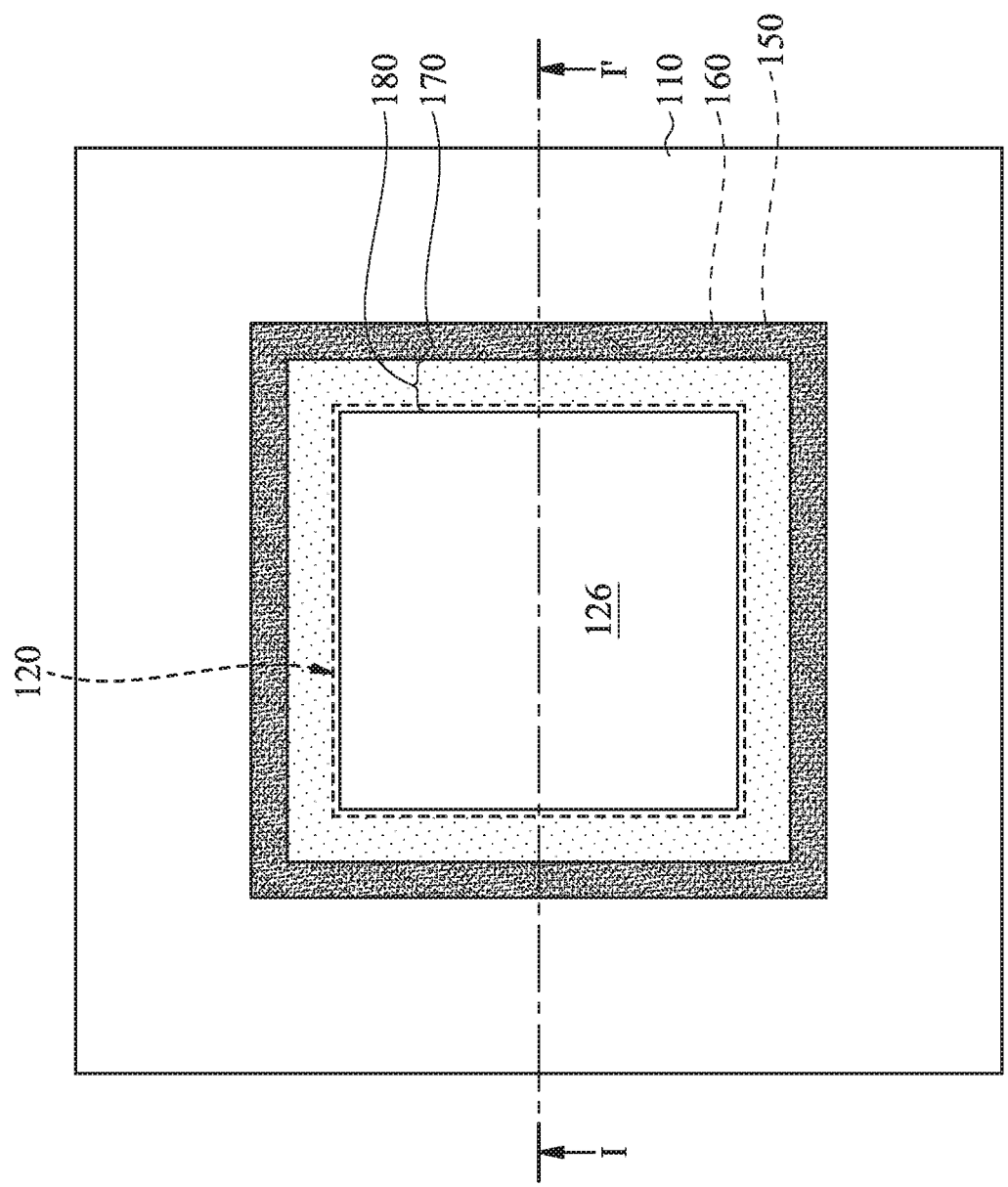

FIG. 1C-1 is a top view of the chip package structure of FIG. 1C, in accordance with some embodiments. FIG. 1C is a cross-sectional view illustrating the chip package structure along a sectional line I-I' in FIG. 1C-1, in accordance with some embodiments. As shown in FIGS. 1C and 1C-1, a heat conductive layer 180 is formed in the gap G2, in accordance with some embodiments.

The gap G2 is filled with the heat conductive layer 180, in accordance with some embodiments. The heat conductive layer 180 is used to conduct heat from the chip 120 to the heat-spreading wall structure 160, in accordance with some embodiments. The heat conductive layer 180 has a top portion 182 extending out of the gap G2, in accordance with some embodiments. The top portion 182 flows onto a top surface 129 of the chip 120, in accordance with some embodiments.

The heat conductive layer 180 is in direct contact with the underfill layer 140, the heat-spreading wall structure 160, the substrate 110, the adhesive layers 150 and 170, and the chip 120, in accordance with some embodiments. The heat conductive layer 180 is between the underfill layer 140 and the heat-spreading wall structure 160, in accordance with some embodiments.

In some embodiments, a lower portion of the heat conductive layer 180 is between the underfill layer 140 and the adhesive layer 150. In some embodiments, the width W1 of the heat conductive layer 180 decreases toward the substrate 110. The width W1 continuously decreases toward the substrate 110, in accordance with some embodiments. As shown in FIG. 1C-1, the heat conductive layer 180 surrounds the chip 120, in accordance with some embodiments. The heat-spreading wall structure 160 surrounds the heat conductive layer 180, in accordance with some embodiments.

The thermal conductivity of the heat conductive layer 180 is greater than that of air, in accordance with some embodiments. That is, the heat conductive layer 180 is made of a material with a thermal conductivity greater than that of air, in accordance with some embodiments. In some embodiments, the material includes a flowable material, such as a polymer material (e.g., silicone) or a combination of polymer and metal (e.g., a silver paste). The heat conductive layer 180 is formed using a dispensing process, in accordance with some embodiments.

Figure 1D:
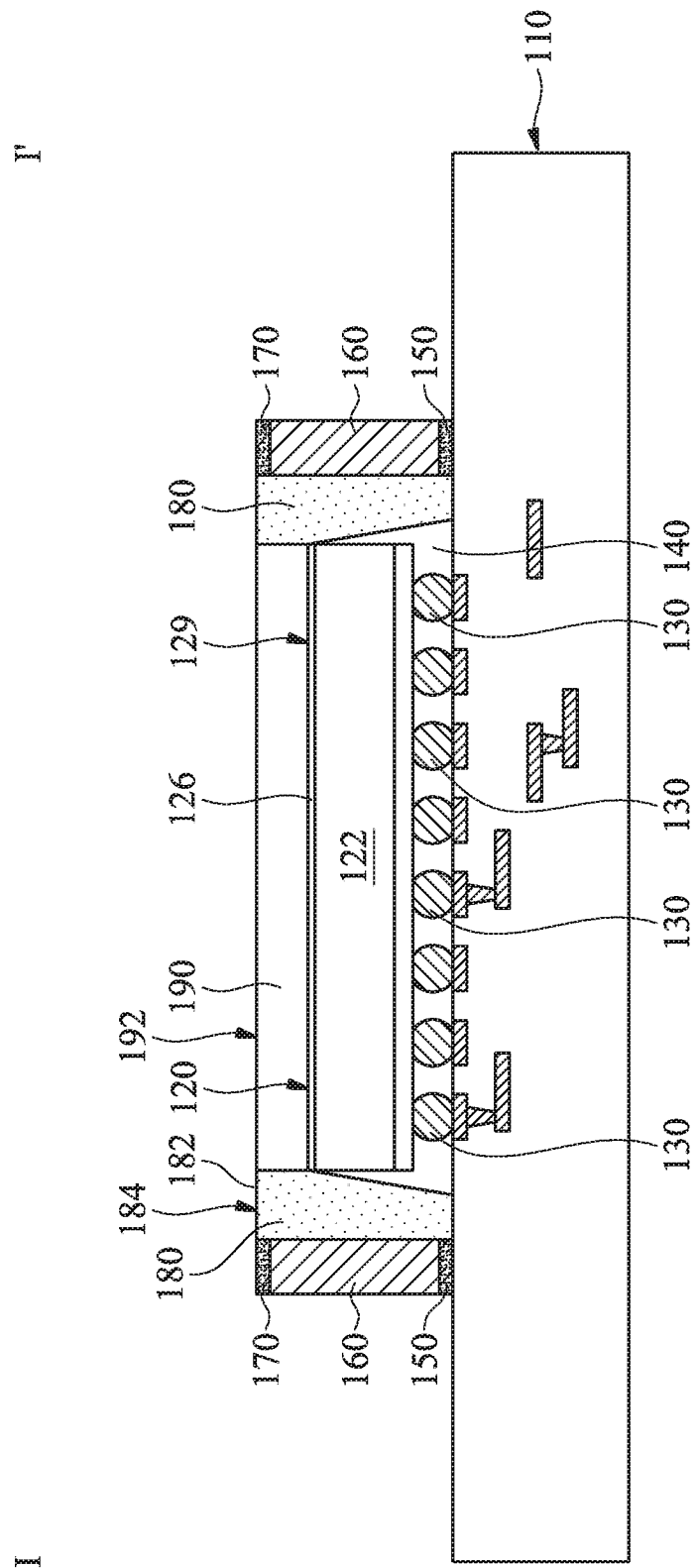
Figures 1, 1D:
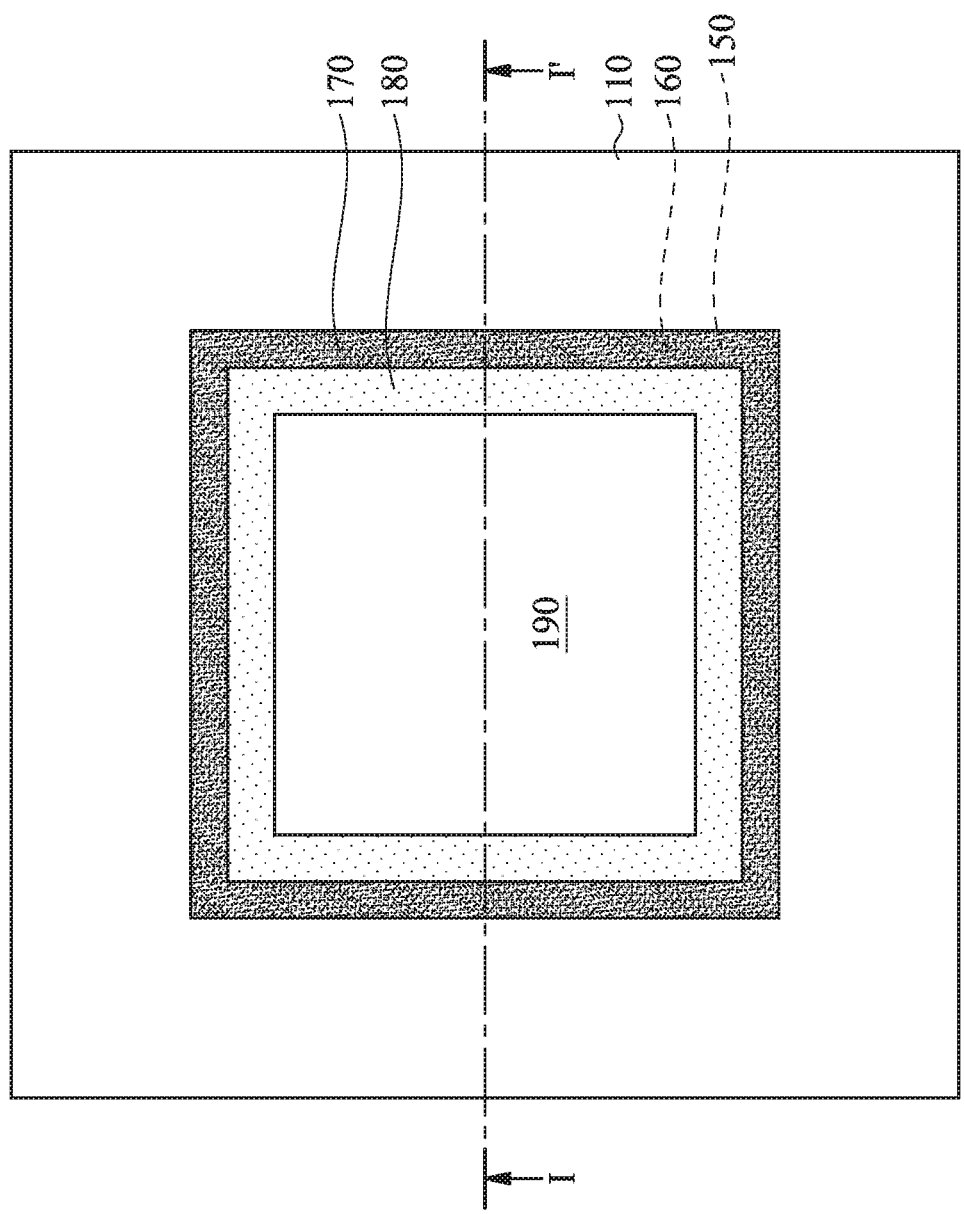

FIG. 1D-1 is a top view of the chip package structure of FIG. 1D, in accordance with some embodiments. FIG. 1D is a cross-sectional view illustrating the chip package structure along a sectional line I-I' in FIG. 1D-1, in accordance with some embodiments. As shown in FIGS. 1D and 1D-1, a heat conductive layer 190 is formed over the chip 120, in accordance with some embodiments. As shown in FIG. 1D, the top portion 182 of the heat conductive layer 180 is between the heat conductive layer 190 and the heat-spreading wall structure 160 (or the adhesive layer 170), in accordance with some embodiments.

As shown in FIG. 1D, the top surface 192 of the heat conductive layer 190 is substantially coplanar with the top surface 184 of the heat conductive layer 180, in accordance with some embodiments. The term "substantially coplanar" in the application may include small deviations from coplanar geometries. The deviations may be due to manufacturing processes. In some other embodiments, the top surface 192 is slightly higher than the top surface 184, in accordance with some embodiments. The heat conductive layer 190 is in direct contact with the interfacial layer 126 of the chip 120 and the heat conductive layer 180, in accordance with some embodiments.

As shown in FIGS. 1D-1, the heat conductive layer 180 continuously surrounds the entire heat conductive layer 190, and the heat-spreading wall structure 160 (or the adhesive layer 170 or 150) continuously surrounds the entire heat conductive layer 180 and the entire heat conductive layer 190, in accordance with some embodiments.

The heat conductive layer 190 is a sheet structure, in accordance with some embodiments. Therefore, the heat conductive layer 190 is also referred to as a heat conductive sheet, in accordance with some embodiments. The heat conductive layer 190 is made of a metal material (e.g., Sn, Ag, Au, or In), an alloy material thereof, or a polymer material doped with a high thermal conductivity material (e.g., graphite, graphene, or metal), in accordance with some embodiments.

In some embodiments, the thermal conductivity of the heat conductive layer 190 is greater than the thermal conductivity of the heat conductive layer 180. In some embodiments, the thermal conductivity of the heat-spreading wall structure 160 is greater than the thermal conductivity of the heat conductive layer 180.

The heat conductive layer 180 is softer than the heat conductive layer 190, in accordance with some embodiments. The heat conductive layer 190 is formed using a disposing process, in accordance with some embodiments. Since the heat conductive layer 180 is softer than the heat conductive layer 190, the (softer) heat conductive layer 180 flowing onto the top surface 129 of the chip 120 (as shown in FIG. 1C) is squeezed out of the top surface 129 by the (harder) heat conductive layer 190, in accordance with some embodiments.

Figure 1E:
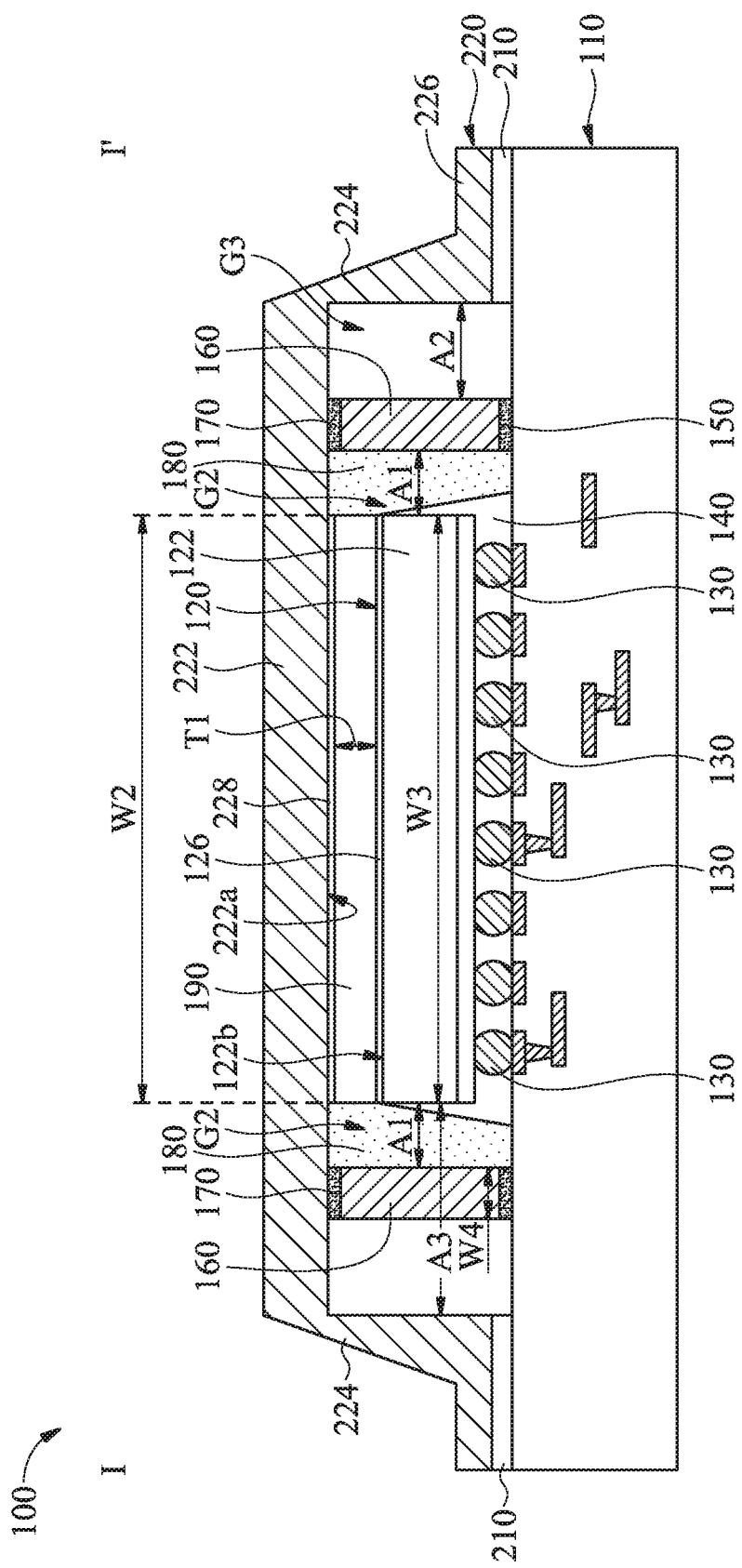
Figures 1, 1E:
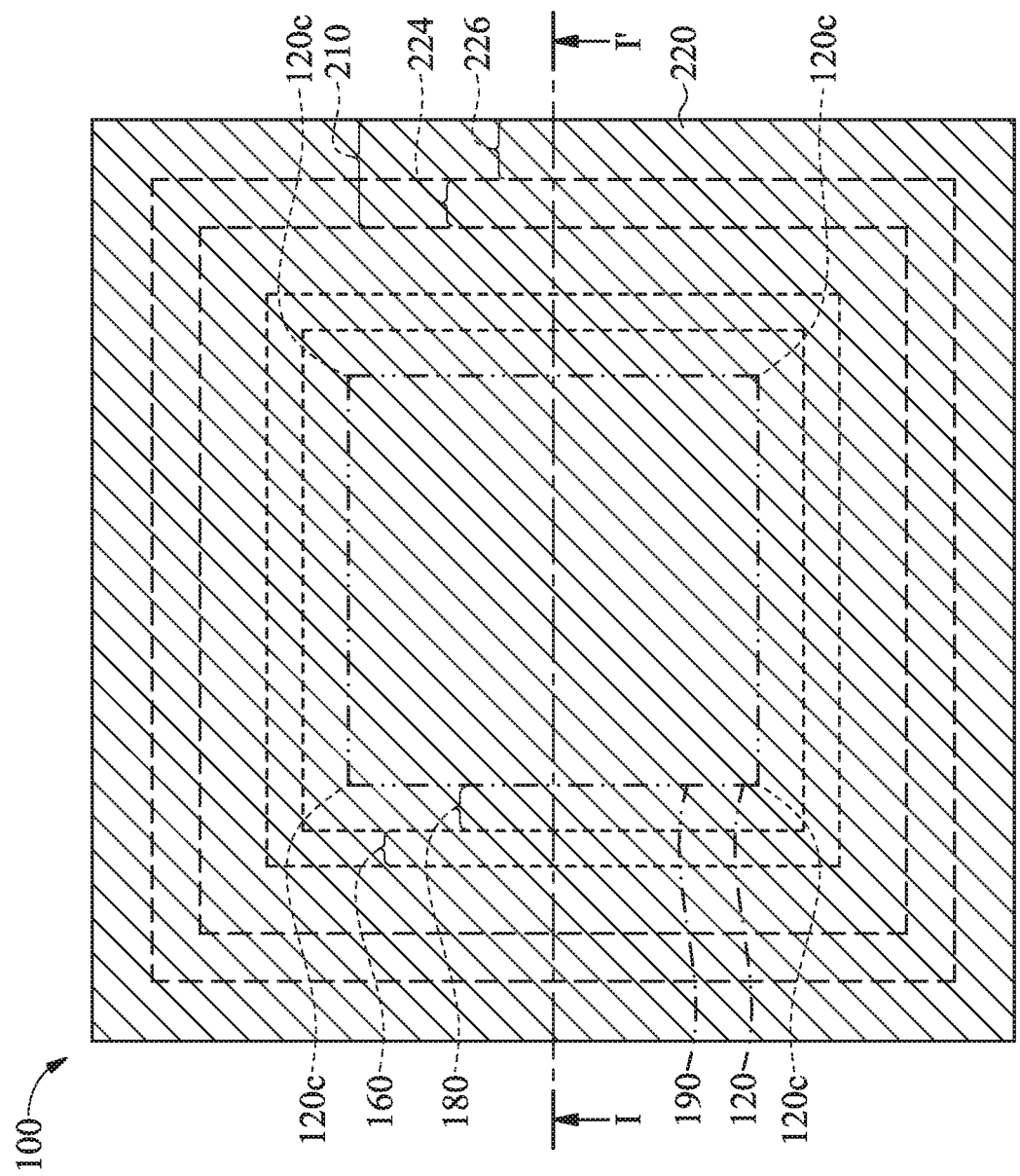

FIG. 1E-1 is a top view of the chip package structure of FIG. 1E, in accordance with some embodiments. FIG. 1E is a cross-sectional view illustrating the chip package structure along a sectional line I-I' in FIG. 1E-1, in accordance with some embodiments. As shown in FIGS. 1E and 1E-1, an adhesive layer 210 is formed over the substrate 110, in accordance with some embodiments. The adhesive layer 210 continuously surrounds the heat-spreading wall structure 160, the heat conductive layer 180, and the heat conductive layer 190 (or the chip 120), in accordance with some embodiments.

The adhesive layer 210 has a ring shape, in accordance with some embodiments. The adhesive layer 210 is made of polymer, such as epoxy or silicone, in accordance with some embodiments. The adhesive layer 210 is formed using a dispensing process, in accordance with some embodiments.

As shown in FIGS. 1E and 1E-1, a heat-spreading lid 220 is disposed over the substrate 110 to cover the heat-spreading wall structure 160, the heat conductive layer 180, the heat conductive layer 190, and the chip 120, in accordance with some embodiments. The heat-spreading lid 220 is bonded to the substrate 110 through the adhesive layer 210, in accordance with some embodiments.

The heat-spreading lid 220 is also bonded to the heat-spreading wall structure 160 through the adhesive layer 170, in accordance with some embodiments. The heat-spreading lid 220 is further bonded to the heat conductive layer 180 and 190, in accordance with some embodiments. After the heat-spreading lid 220 is disposed over the substrate 110, the heat conductive layer 180 is in direct contact with the heat-spreading lid 220, the heat conductive layer 190, the underfill layer 140, the substrate 110, the heat-spreading wall structure 160, and the adhesive layers 150 and 170, in accordance with some embodiments.

The heat conductive layer 190 is in direct contact with the heat-spreading lid 220, in accordance with some embodiments. The heat conductive layer 190 has a thickness T1 ranging from about 200 µm to about 400 µm, in accordance with some embodiments. The heat-spreading lid 220 includes a top plate 222, a lid sidewall structure 224, a brim portion 226, and an interfacial layer 228, in accordance with some embodiments. The lid sidewall structure 224 is under the top plate 222, in accordance with some embodiments.

The lid sidewall structure 224 is between the top plate 222 and the brim portion 226, in accordance with some embodiments. The lid sidewall structure 224 is connected to the top plate 222 and the brim portion 226, in accordance with some embodiments. The brim portion 226 is bonded to the adhesive layer 210, in accordance with some embodiments. The interfacial layer 228 is over a lower surface 222a of the top plate 222, in accordance with some embodiments.

The interfacial layer 228 is between and connected to the top plate 222 and the heat conductive layer 190, in accordance with some embodiments. The interfacial layer 228 includes a nickel layer (not shown) and a gold layer (not shown) sequentially stacked over the lower surface 222a of the top plate 222, in accordance with some embodiments.

The heat-spreading wall structure 160 is between the chip 120 and the lid sidewall structure 224, in accordance with some embodiments. In some embodiments, the distance A1 between the chip 120 and the heat-spreading wall structure 160 is less than the distance A2 between the heat-spreading wall structure 160 and the lid sidewall structure 224.

The chip 120 is spaced apart from the lid sidewall structure 224 by a distance A3, in accordance with some embodiments. In some embodiments, a ratio (A1/A3) of the distance A1 to the distance A3 ranges from about 0.15 to about 0.35. In some cases, if the ratio (A1/A3) is less than 0.15, the gap G2 may be too narrow to be smoothly filled with the heat conductive layer 180.

In some cases, if the ratio (A1/A3) is greater than 0.35, the heat conductive path between the chip 120 and the heat-spreading wall structure 160 may be too long, which may result in that the heat from the chip 120 may be unable to be efficiently transferred to the heat-spreading wall structure 160. In some embodiments, a ratio (A1/T1) of the distance A1 to the thickness T1 of the heat conductive layer 190 ranges from about 1 to about 5.

There is an air gap G3 between the heat-spreading wall structure 160 and the lid sidewall structure 224, in accordance with some embodiments. The heat-spreading lid 220 is made of a high thermal conductivity material, such as a metal material (aluminum or copper), an alloy material (e.g., stainless steel), or aluminum-silicon carbide (AlSiC), in accordance with some embodiments.

After the heat-spreading lid 220 is disposed over the substrate 110, an annealing process is performed, in accordance with some embodiments. During the annealing process, the heat conductive layer 190 is melted, which improves the adhesion between the heat conductive layer 190 and the interfacial layer 126 of the chip 120 and between the heat conductive layer 190 and the interfacial layer 228 of the heat-spreading lid 220, in accordance with some embodiments. After the annealing process, the melted heat conductive layer 190 is solidified, in accordance with some embodiments.

In some embodiments, a width W2 of the heat conductive layer 190 is substantially equal to a width W3 of the chip 120. The term "substantially equal to" in the application means "within 10%", in accordance with some embodiments. For example, the term "substantially equal to" means the difference between the widths W2 and W3 is within 10% of the average width between the heat conductive layer 190 and the chip 120, in accordance with some embodiments. The difference may be due to manufacturing processes.

After the annealing process, the interfacial layer 126 includes a titanium layer (not shown), a nickel-vanadium (NiV) layer (not shown), an Indium-Nickel-Gold (InNiAu) layer (not shown), and an Indium-Gold (InAu) layer (not shown) sequentially stacked over the back surface 122b, in accordance with some embodiments.

After the annealing process, the interfacial layer 228 includes a nickel layer (not shown), an Indium-Nickel-Gold (InNiAu) layer (not shown), and an Indium-Gold (InAu) layer (not shown) sequentially stacked over the lower surface 222a of the top plate 222, in accordance with some embodiments.

The heat conductive layer 180 is solidified by the annealing process, in accordance with some embodiments. After the annealing process, the heat conductive layer 180 is still softer than the heat conductive layer 190, in accordance with some embodiments. The Young's Modulus of the heat conductive layer 190 is greater than the Young's Modulus of the heat conductive layer 180, in accordance with some embodiments. In this step, a chip package structure 100 is substantially formed, in accordance with some embodiments.

The heat-spreading wall structure 160 has a width W4, in accordance with some embodiments. The chip 120 is spaced apart from the lid sidewall structure 224 by a distance A3, in accordance with some embodiments. In some embodiments, a ratio (W4/A3) of the width W4 to the distance A3 ranges from about 0.05 to about 0.2, in accordance with some embodiments.

In some cases, if the ratio (W4/A3) is less than 0.05, the heat conductive path between the heat-spreading wall structure 160 and the heat-spreading lid 220 may be too narrow to efficiently transfer the heat from the chip 120 to the heat-spreading lid 220.

In some cases, if the ratio (W4/A3) is greater than 0.2, the thermal stress between the heat-spreading wall structure 160 and the substrate 110 may be too large, which may affect the structural stability of the heat-spreading wall structure 160. The heat-spreading wall structure 160 and the substrate 110 have different thermal expansion coefficients, in accordance with some embodiments.

The heat conductive layer 190 creates a heat conductive path between the chip 120 and the heat-spreading lid 220, and the heat conductive layer 180 and the heat-spreading wall structure 160 together create an additional heat conductive path between the chip 120 and the heat-spreading lid 220, in accordance with some embodiments. Therefore, the additional heat conductive path improves the heat dissipation efficiency of the chip package structure 100, which improves the reliability of the chip package structure 100, in accordance with some embodiments.

Since the heat conductive layer 180 is softer than the heat conductive layer 190, the heat conductive layer 180 is able to relieve the thermal stress produced between the chip 120 (e.g., corner portions 120c of the chip 120) and the heat conductive layer 190 in subsequent annealing processes, in accordance with some embodiments. Therefore, the softer heat conductive layer 180 prevents the harder heat conductive layer 190 (e.g., the heat conductive layer 190 adjacent to the corner portions 120c) from cracking in subsequent annealing processes, in accordance with some embodiments.

As a result, the reliability of the chip package structure 100 is improved, in accordance with some embodiments.

Figure 2A:
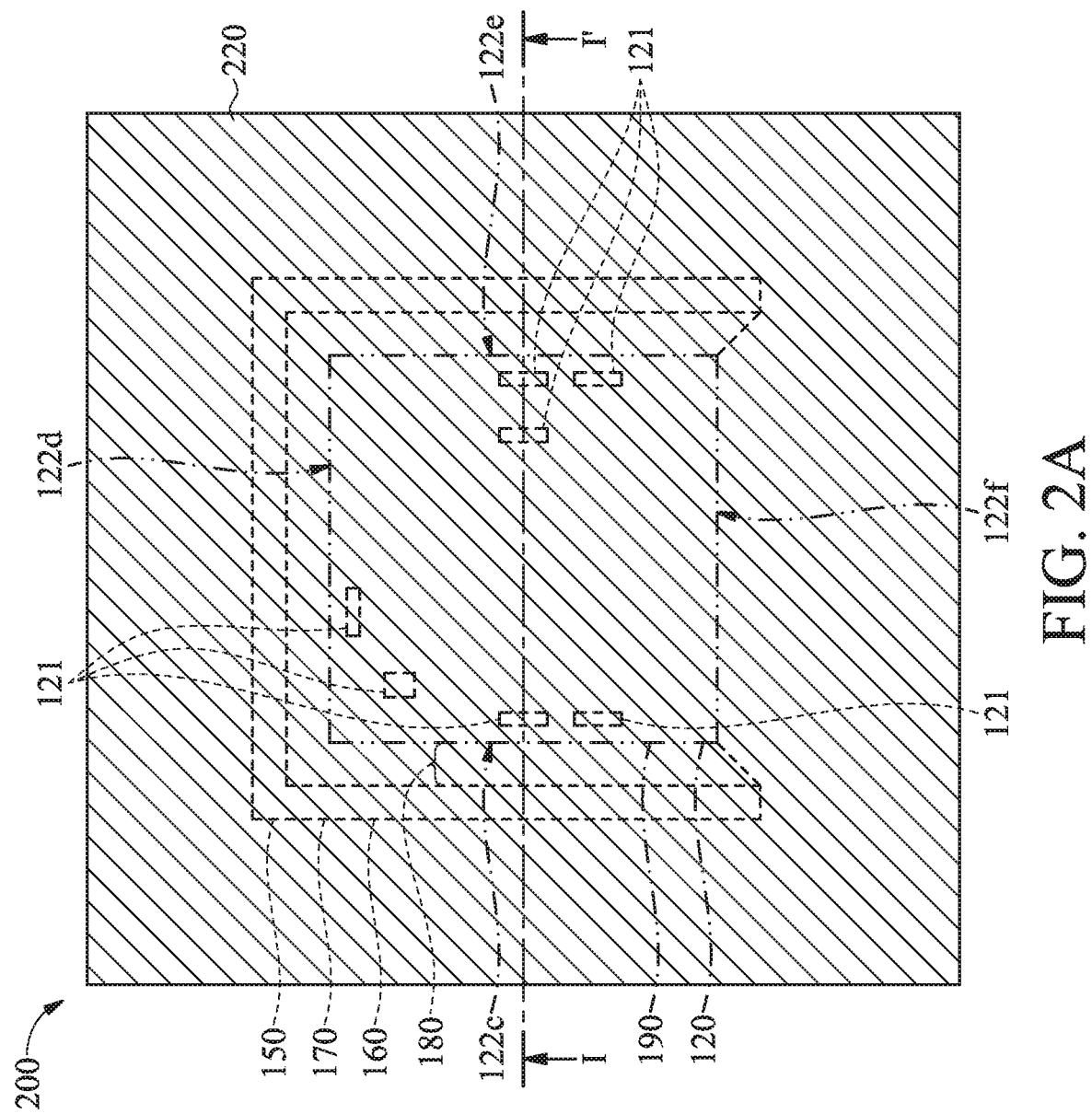
FIG. 2A is a top view of a chip package structure, in accordance with some embodiments.
Figure 2B:
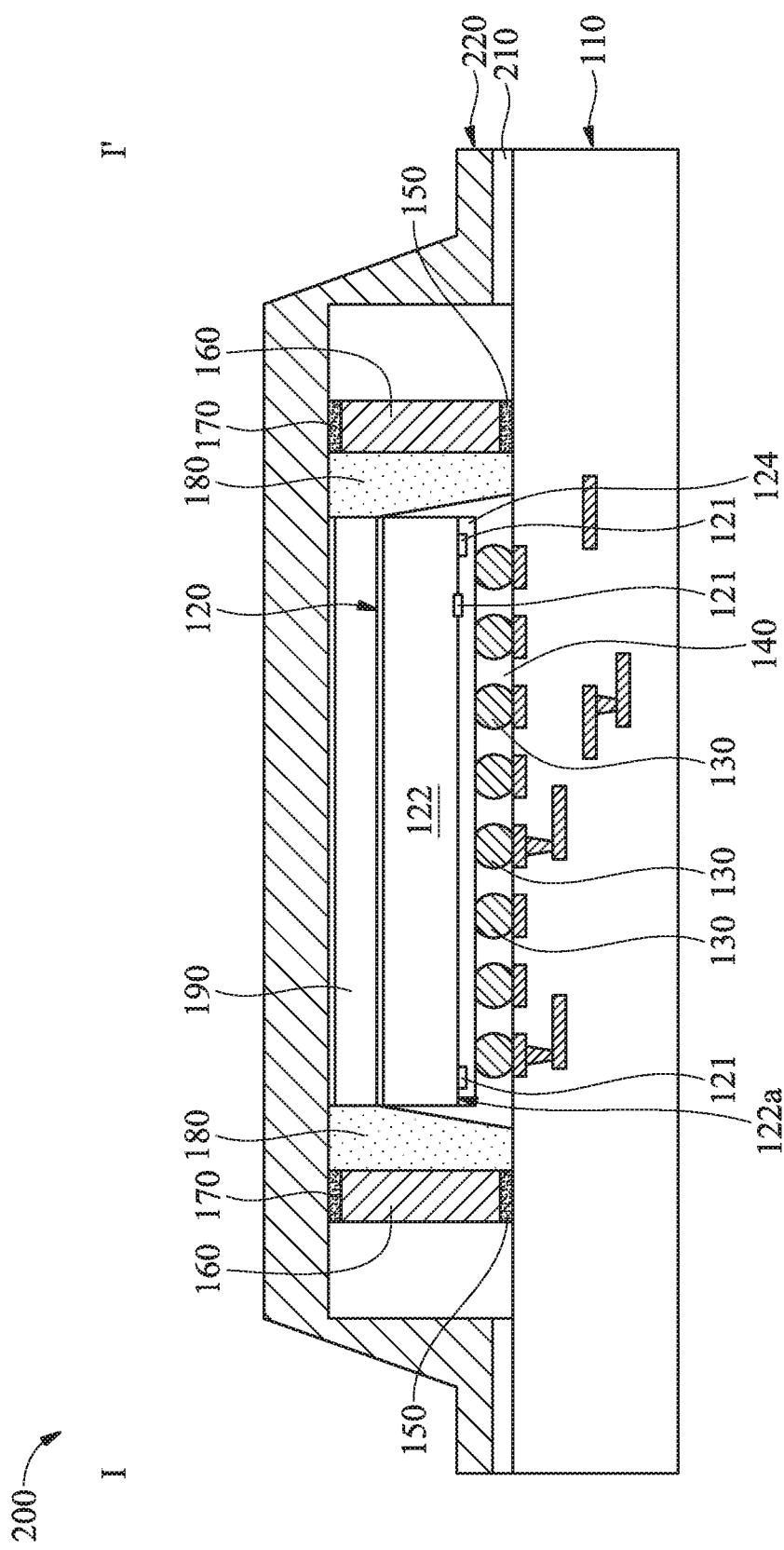
FIG. 2B is a cross-sectional view illustrating the chip package structure along a sectional line I-I' in FIG. 2A, in accordance with some embodiments.

FIG. 2A is a top view of a chip package structure 200, in accordance with some embodiments. FIG. 2B is a cross-sectional view illustrating the chip package structure 200 along a sectional line I-I' in FIG. 2A, in accordance with some embodiments. As shown in FIGS. 2A and 2B, the chip package structure 200 is similar to the chip package structure 100 of FIG. 1E-1, except that the heat-spreading wall structure 160 has a U-shape, in accordance with some embodiments. The adhesive layers 150 and 170 have a U-shape, in accordance with some embodiments. The heat conductive layer 180 has a U-shape, in accordance with some embodiments.

The chip 120 has high performance devices 121 formed at the front surface 122a, in accordance with some embodiments. The high performance devices 121 includes high speed integrated circuits, memory devices, high operating frequency devices, or high current devices, in accordance with some embodiments.

The high performance devices 121 are positioned closer to the sides 122c, 122d, and 122e of the chip 120 and farther away from the side 122f of the chip 120, in accordance with some embodiments. Therefore, the heat-spreading wall structure 160 and the heat conductive layer 180 adjacent to the sides 122c, 122d, and 122e are able to quickly conduct the heat from the high performance devices 121 to the heat-spreading lid 220, in accordance with some embodiments.

The U-shaped design of the heat-spreading wall structure 160, the heat conductive layer 180, and the adhesive layers 150 and 170 may reduce the material cost of the heat-spreading wall structure 160, the heat conductive layer 180, and the adhesive layers 150 and 170.

Figure 3:
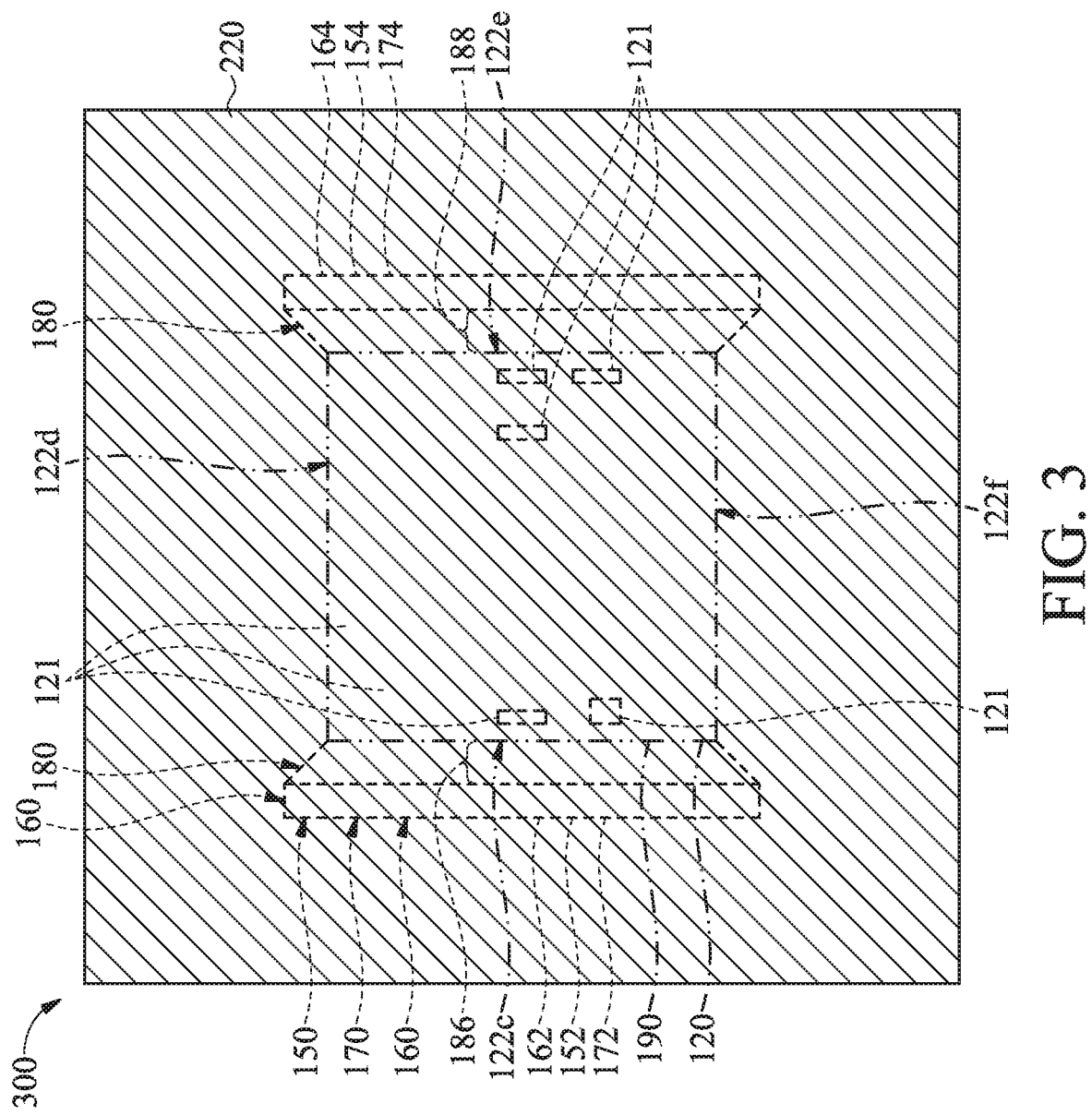
FIG. 3 is a top view of a chip package structure, in accordance with some embodiments.

FIG. 3 is a top view of a chip package structure 300, in accordance with some embodiments. As shown in FIG. 3, the chip package structure 300 is similar to the chip package structure 200 of FIG. 2A, except that the heat-spreading wall structure 160 has strip portions 162 and 164 spaced apart from each other, in accordance with some embodiments.

The adhesive layer 150 has strip portions 152 and 154 spaced apart from each other, in accordance with some embodiments. The adhesive layer 170 has strip portions 172 and 174 spaced apart from each other, in accordance with some embodiments. The heat conductive layer 180 has strip portions 186 and 188 spaced apart from each other, in accordance with some embodiments.

The strip portions 152, 162, 172, and 186 are adjacent to the side 122c of the chip 120, in accordance with some embodiments. The strip portions 154, 164, 174, and 188 are adjacent to the side 122e of the chip 120, in accordance with some embodiments.

The high performance devices 121 of the chip 120 are positioned closer to the sides 122c and 122e of the chip 120 and farther away from the sides 122d and 122f of the chip 120, in accordance with some embodiments. Therefore, the heat-spreading wall structure 160 and the heat conductive layer 180 adjacent to the sides 122c and 122e are able to quickly conduct the heat from the high performance devices 121 to the heat-spreading lid 220, in accordance with some embodiments.

Figure 4:
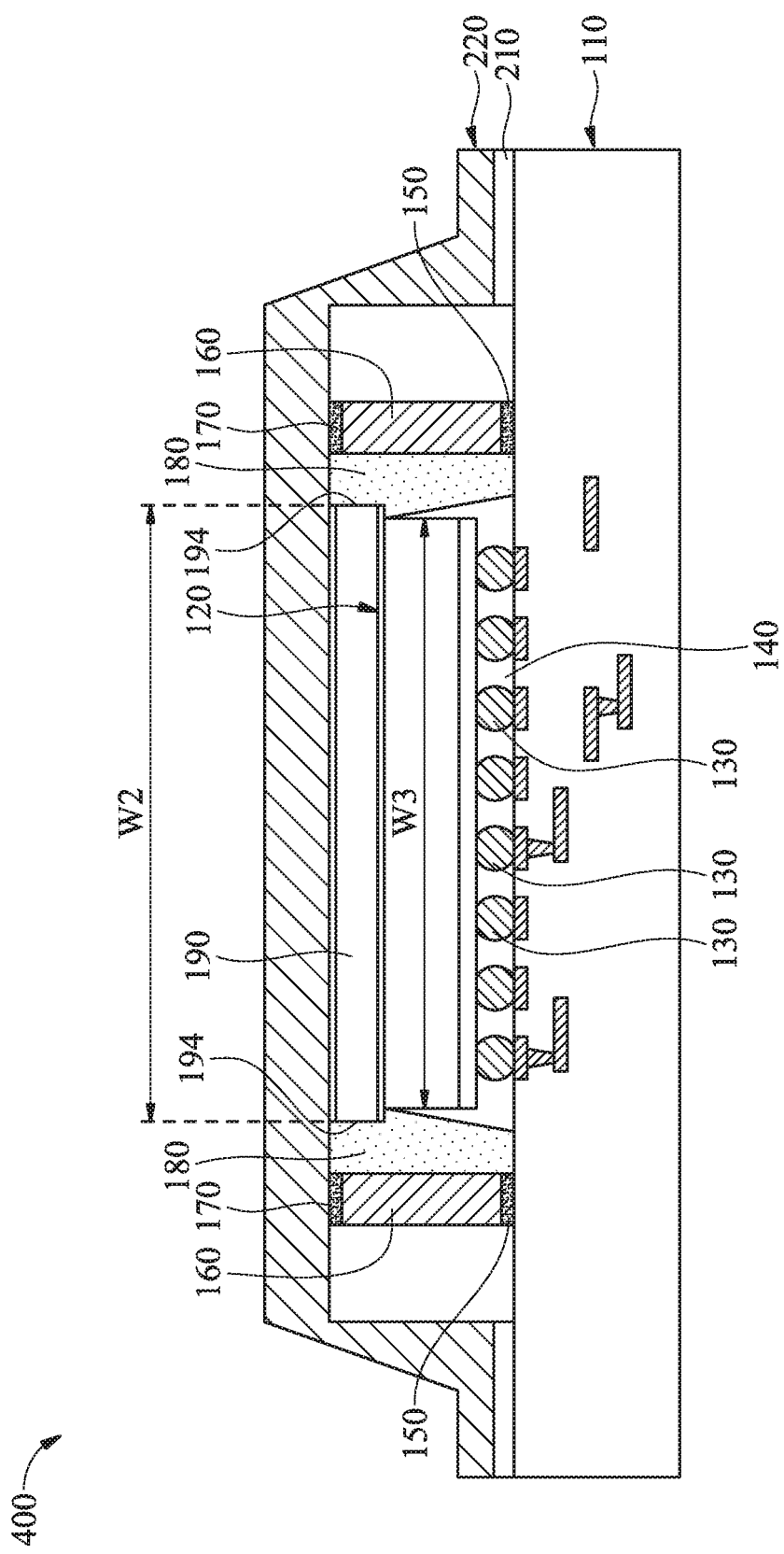
FIG. 4 is a cross-sectional view of a chip package structure, in accordance with some embodiments.

FIG. 4 is a cross-sectional view of a chip package structure 400, in accordance with some embodiments. As shown in FIG. 4, the chip package structure 400 is similar to the chip package structure 100 of FIG. 1E, except that the heat conductive layer 190 is wider than the chip 120, in accordance with some embodiments. That is, a width W2 of the heat conductive layer 190 is greater than a width W3 of the chip 120, in accordance with some embodiments.

The heat conductive layer 190 is partially formed over the heat conductive layer 180, in accordance with some embodiments. In some embodiments, edge portions 194 of the heat conductive layer 190 are embedded in the heat conductive layer 180.

In some embodiments, the thermal conductivity of the heat conductive layer 190 is greater that of the heat conductive layer 180. The (wider) heat conductive layer 190 may increase the contact area between the heat conductive layer 190 and the heat-spreading lid 220, which improves the thermal conductive efficiency between the heat conductive layer 190 and the heat-spreading lid 220, in accordance with some embodiments. As a result, the heat dissipation efficiency of the chip package structure 400 is improved, in accordance with some embodiments.

Figure 5A:
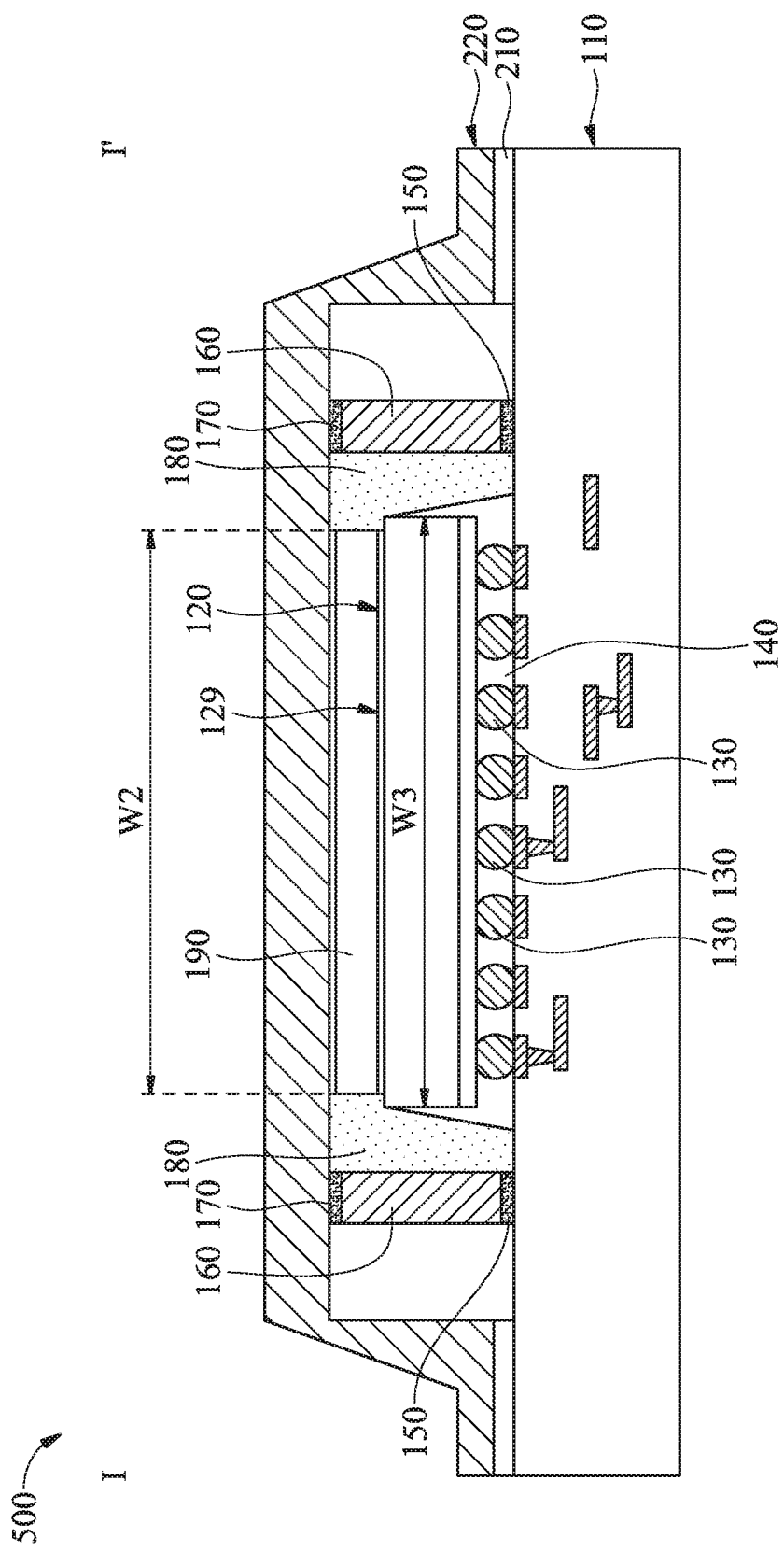
FIG. 5A is a cross-sectional view of a chip package structure, in accordance with some embodiments.
Figure 5B:
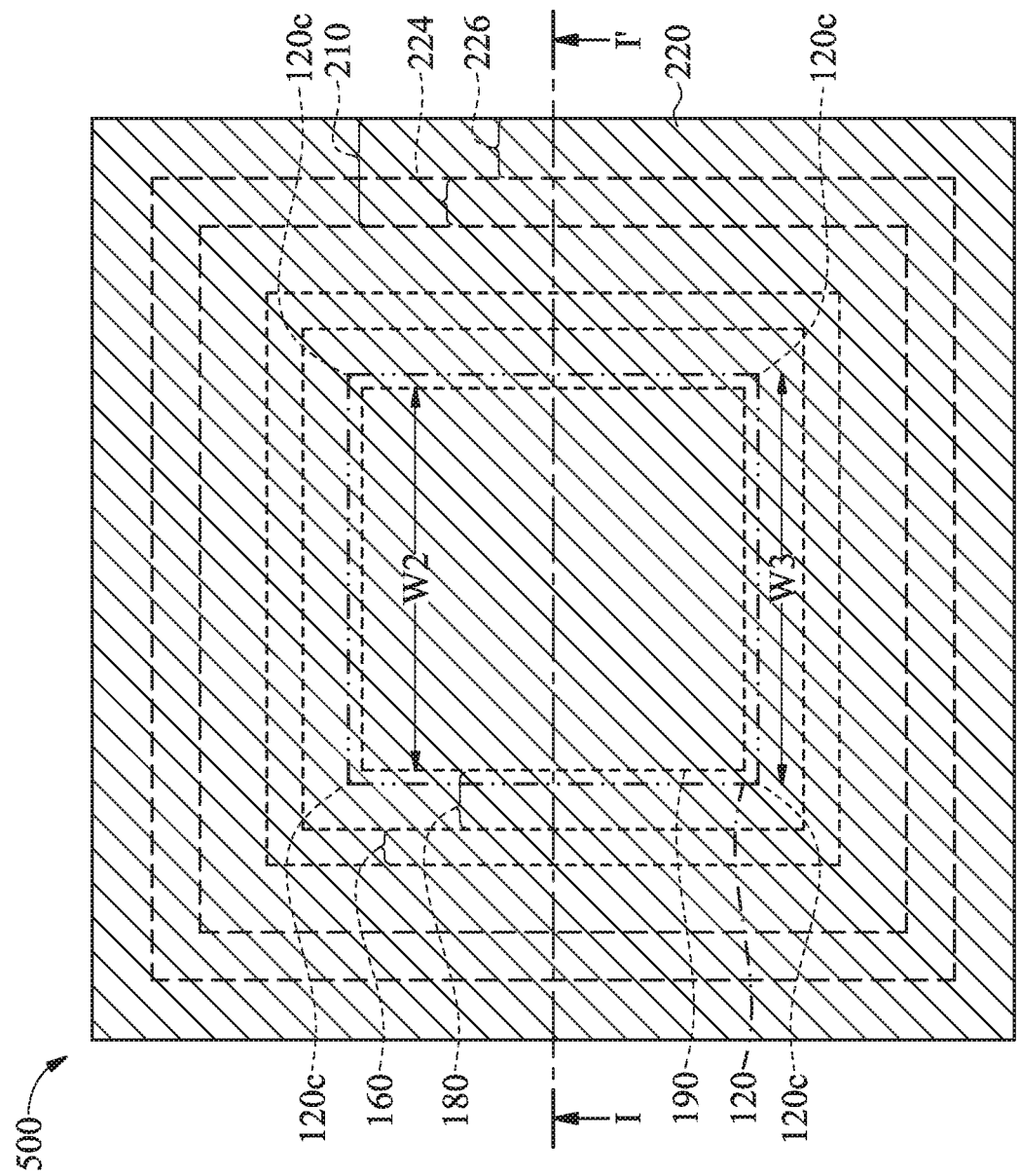
FIG. 5B is a top view of the chip package structure of FIG. 5A, in accordance with some embodiments.

FIG. 5A is a cross-sectional view of a chip package structure 500, in accordance with some embodiments. FIG. 5B is a top view of the chip package structure 500 of FIG. 5A, in accordance with some embodiments. FIG. 5A is a cross-sectional view illustrating the chip package structure 500 along a sectional line I-I' in FIG. 5B, in accordance with some embodiments.

As shown in FIGS. 5A and 5B, the chip package structure 500 is similar to the chip package structure 100 of FIGS. 1E and 1E-1, except that the heat conductive layer 190 is narrower than the chip 120, in accordance with some embodiments. That is, a width W2 of the heat conductive layer 190 is less than a width W3 of the chip 120, in accordance with some embodiments. The heat conductive layer 180 partially extends onto the top surface 129 of the chip 120, in accordance with some embodiments.

The thermal stress tends to concentrate in the corner portions 120c of the chip 120, in accordance with some embodiments. Since the (soft) heat conductive layer 180 wraps the corner portions 120c, the (soft) heat conductive layer 180 may relieve most of the thermal stress in the corner portions 120c and prevent the (harder) heat conductive layer 190 from cracking in subsequent annealing processes.

Figure 6:
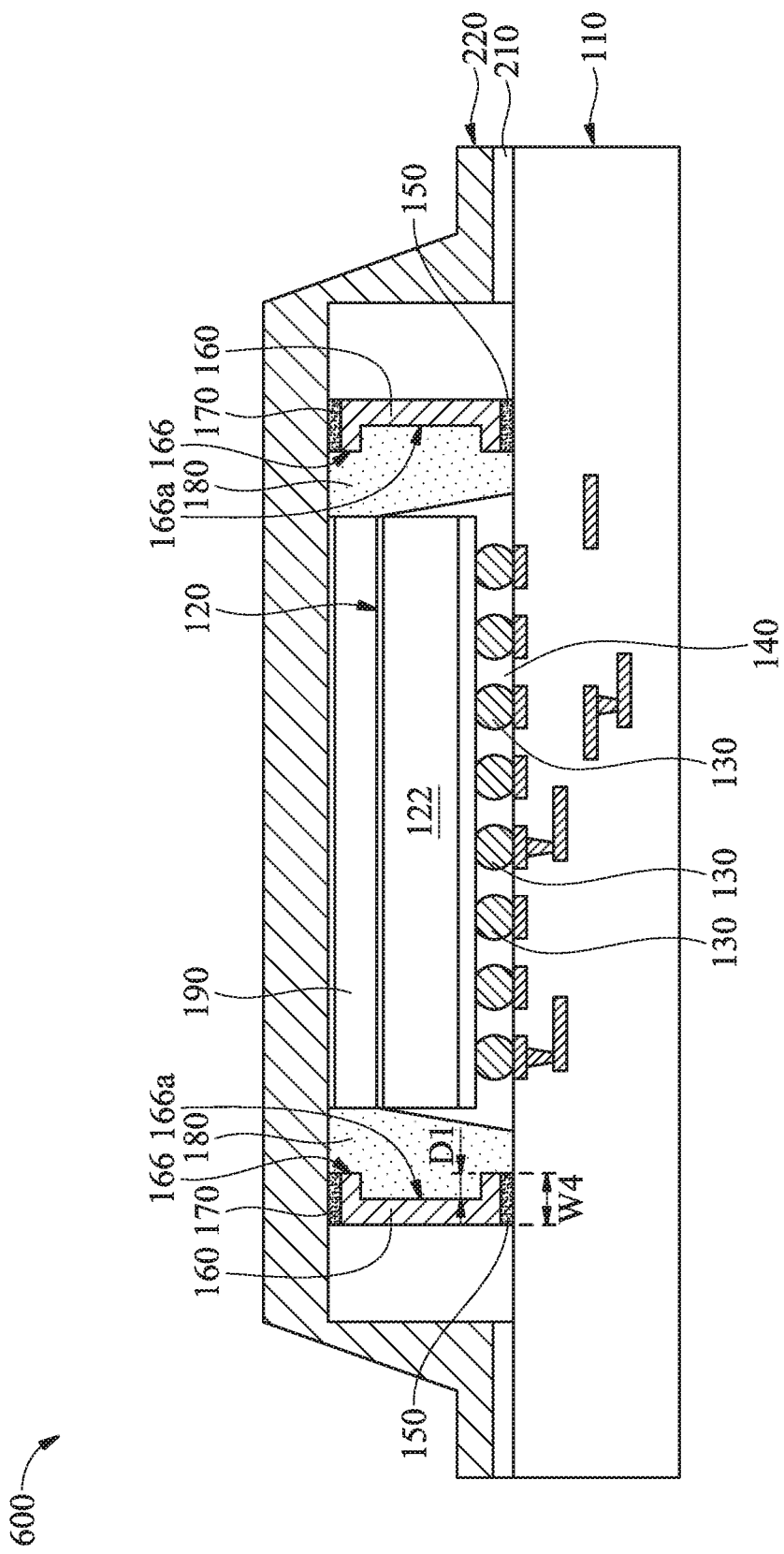
FIG. 6 is a cross-sectional view of a chip package structure, in accordance with some embodiments.

FIG. 6 is a cross-sectional view of a chip package structure 600, in accordance with some embodiments. As shown in FIG. 6, the chip package structure 600 is similar to the chip package structure 100 of FIG. 1E, except that the heat-spreading wall structure 160 has a sidewall 166 facing the chip 120, and the sidewall 166 has a recess 166a, in accordance with some embodiments. The recess 166a is filled with the heat conductive layer 180, in accordance with some embodiments.

The recess 166a is able to increase the contact area between the heat conductive layer 180 and the heat-spreading wall structure 160, which improves the thermal conductive efficiency between the heat conductive layer 180 and the heat-spreading wall structure 160, in accordance with some embodiments.

The recess 166a has a depth D1, in accordance with some embodiments. The heat-spreading wall structure 160 has a width W4, in accordance with some embodiments. In some embodiments, a ratio (D1/W4) of the depth D1 to the width W4 of the heat-spreading wall structure 160 ranges from about 0.3 to about 0.6.

In some cases, if the ratio (D1/W4) is less than 0.3, the increase in the contact area between the heat conductive layer 180 and the heat-spreading wall structure 160 may be not obvious. In some cases, if the ratio (D1/W4) is greater than 0.6, the structural strength of the heat-spreading wall structure 160 may be damaged by the recess 166a.

Figure 7:
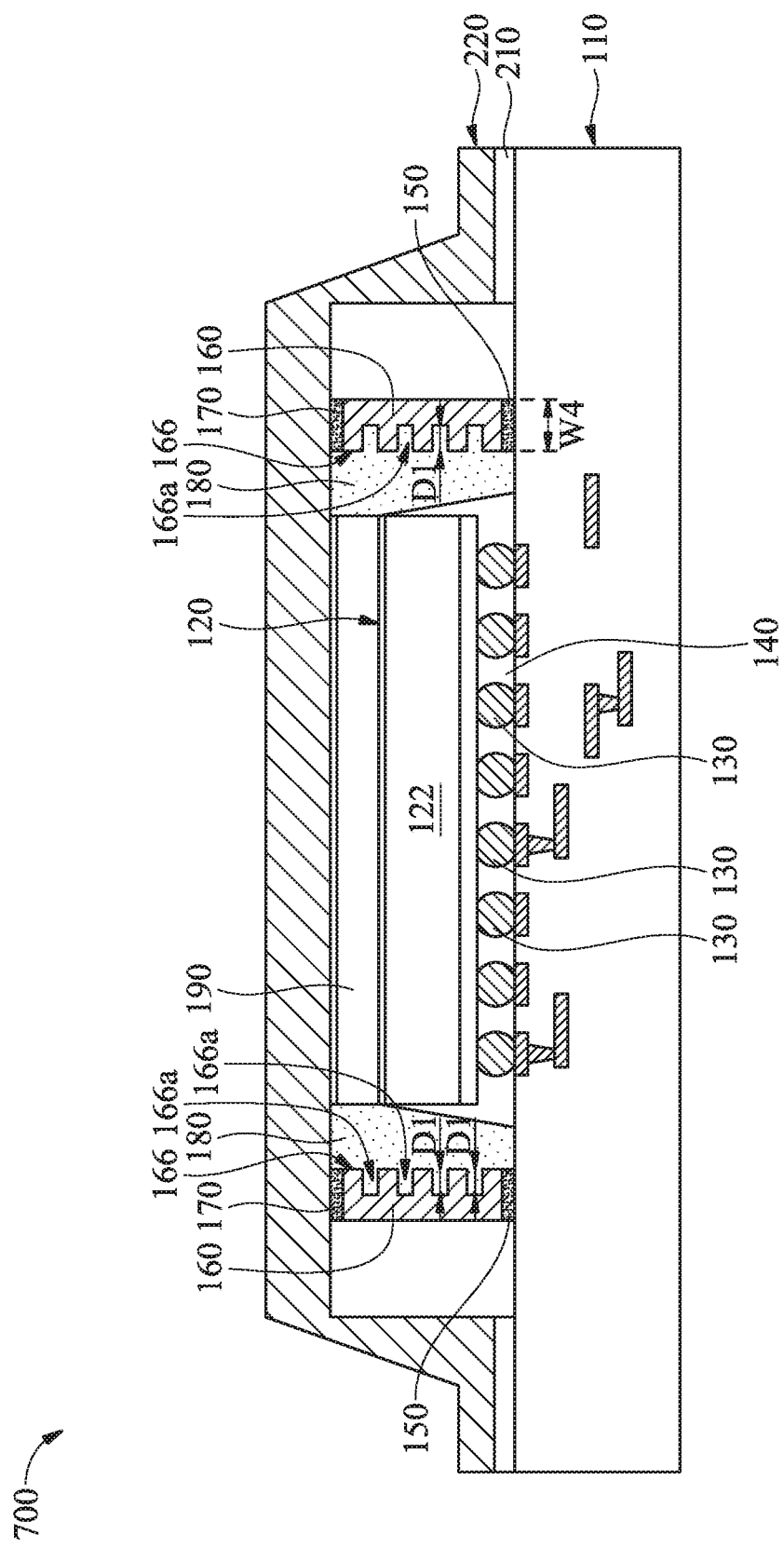
FIG. 7 is a cross-sectional view of a chip package structure, in accordance with some embodiments.

FIG. 7 is a cross-sectional view of a chip package structure 700, in accordance with some embodiments. As shown in FIG. 7, the chip package structure 700 is similar to the chip package structure 600 of FIG. 6, except that the sidewall 166 of the heat-spreading wall structure 160 has recesses 166a, in accordance with some embodiments.

The recesses 166a are filled with the heat conductive layer 180, in accordance with some embodiments. The recesses 166a have the same depth D1, in accordance with some embodiments. In some embodiments, a ratio (D1/W4) of the depth D1 to the width W4 of the heat-spreading wall structure 160 ranges from about 0.3 to about 0.6.

Figure 8:
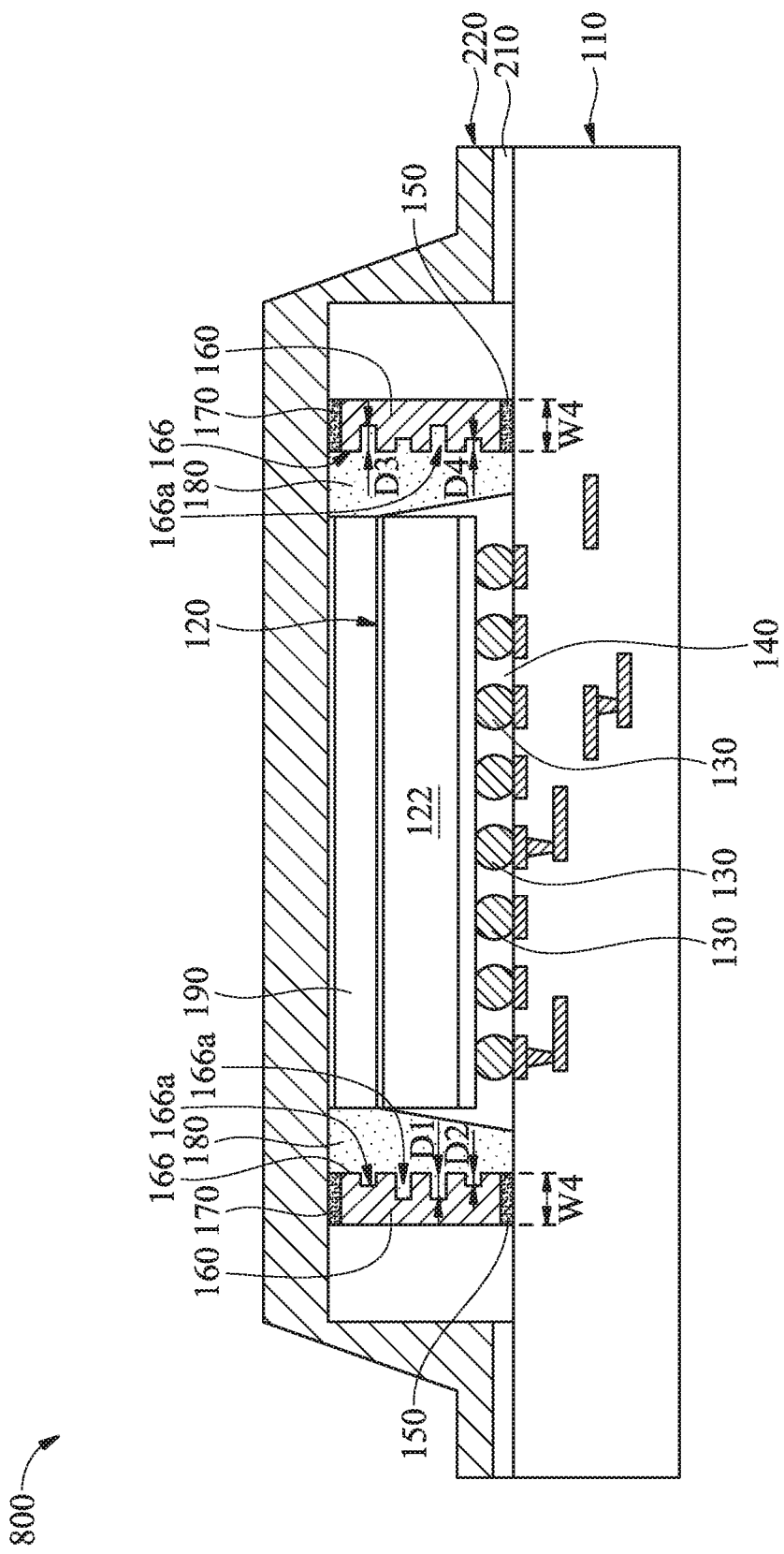
FIG. 8 is a cross-sectional view of a chip package structure, in accordance with some embodiments.

FIG. 8 is a cross-sectional view of a chip package structure 800, in accordance with some embodiments. As shown in FIG. 8, the chip package structure 800 is similar to the chip package structure 700 of FIG. 7, except that the recesses 166a of the sidewall 166 of the heat-spreading wall structure 160 have different depths D1, D2, D3, and D4, in accordance with some embodiments.

In some embodiments, a ratio (D1/W4) of the depth D1 to the width W4 of the heat-spreading wall structure 160 ranges from about 0.3 to about 0.6. In some embodiments, a ratio (D2/W4) of the depth D2 to the width W4 ranges from about 0.3 to about 0.6. In some embodiments, a ratio (D3/W4) of the depth D3 to the width W4 ranges from about 0.3 to about 0.6. In some embodiments, a ratio (D4/W4) of the depth D4 to the width W4 ranges from about 0.3 to about 0.6.

Figure 9:
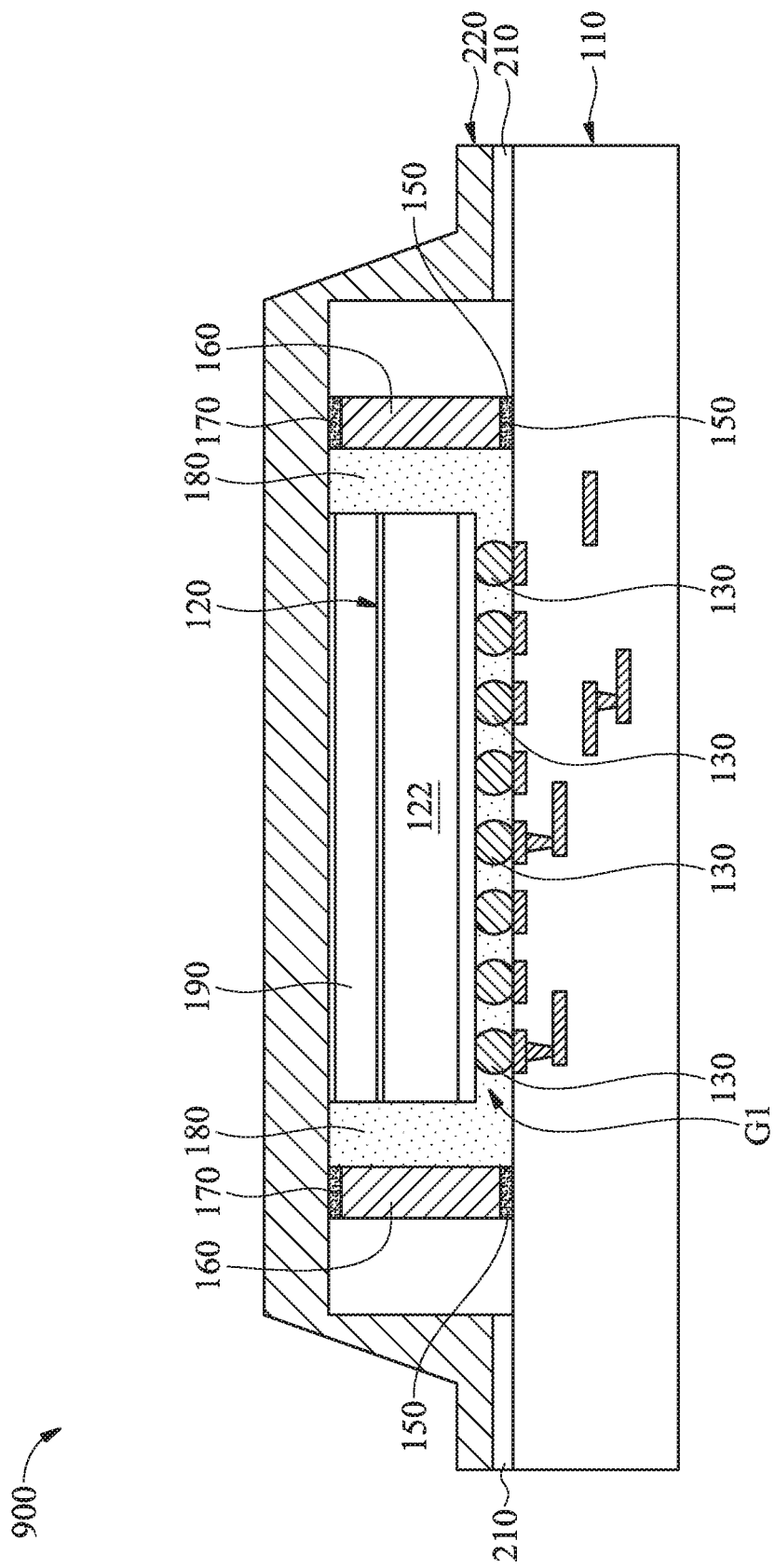
FIG. 9 is a cross-sectional view of a chip package structure, in accordance with some embodiments.

FIG. 9 is a cross-sectional view of a chip package structure 900, in accordance with some embodiments. As shown in FIG. 9, the chip package structure 900 is similar to the chip package structure 100 of FIG. 1E, except that the heat conductive layer 180 extends into the gap G1 between the chip 120 and the substrate 110, in accordance with some embodiments. The heat conductive layer 180 in the gap G1 surrounds the bumps 130, in accordance with some embodiments. In the chip package structure 900, an underfill layer is not formed, in accordance with some embodiments.

Figure 10:
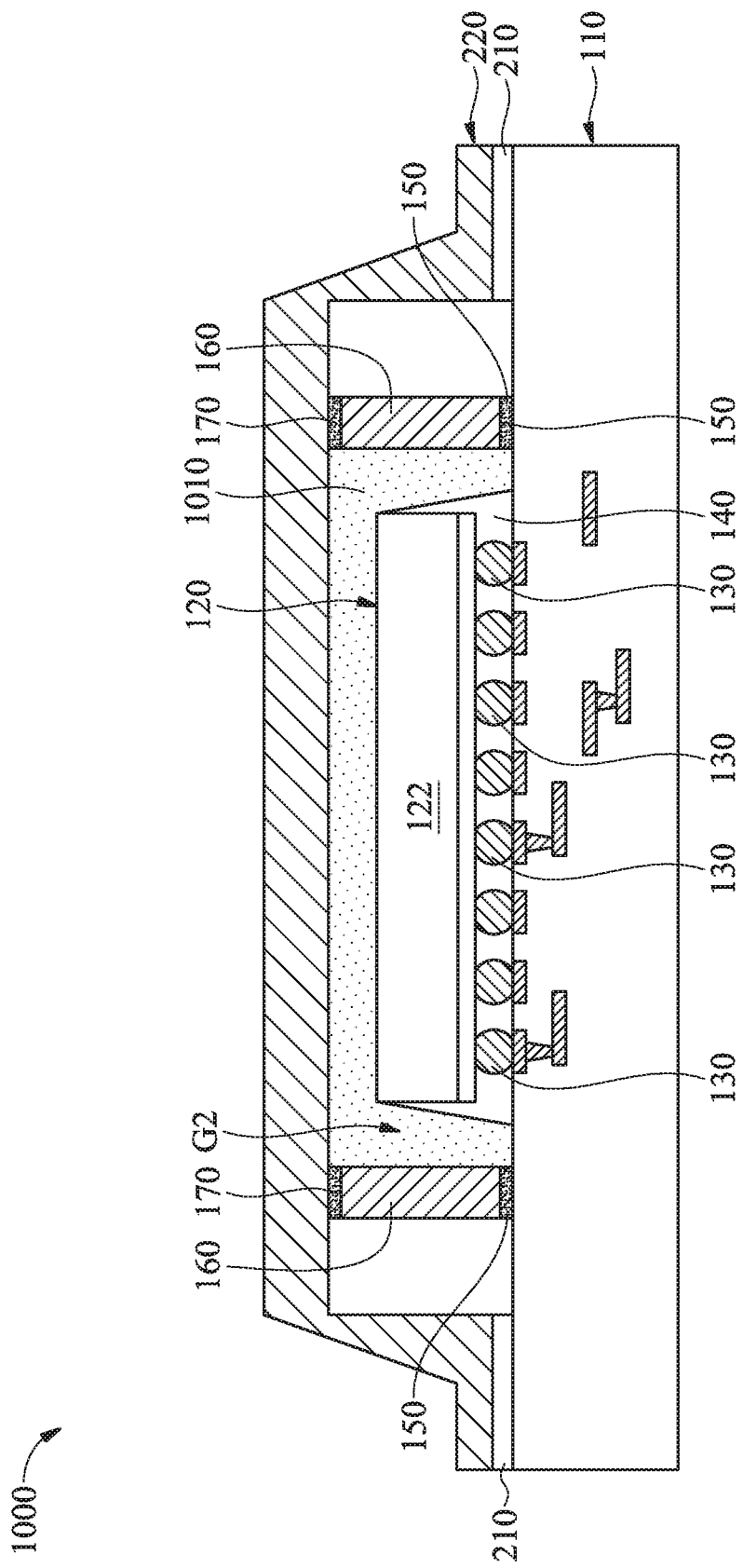
FIG. 10 is a cross-sectional view of a chip package structure, in accordance with some embodiments.

FIG. 10 is a cross-sectional view of a chip package structure 1000, in accordance with some embodiments. After the step of FIG. 1B, as shown in FIG. 10, a heat conductive layer 1010 is formed in the gap G2 between the chip 120 and the heat-spreading wall structure 160 and over the chip 120, in accordance with some embodiments. The heat conductive layer 1010 is in direct contact with the heat-spreading lid 220, the chip 120, the heat-spreading wall structure 160, the substrate 110, the underfill layer 140, and the adhesive layers 150 and 170, in accordance with some embodiments.

The heat conductive layer 1010 is made of a material with a thermal conductivity greater than that of air, in accordance with some embodiments. In some embodiments, the material includes a flowable material, such as a polymer material (e.g., silicone) or a combination of polymer and metal (e.g., a silver paste).

The heat conductive layer 1010 is formed using a dispensing process, in accordance with some embodiments. Thereafter, the step of FIG. 1E is performed, in accordance with some embodiments. In this step, the chip package structure 1000 is substantially formed, in accordance with some embodiments.

Figure 11:
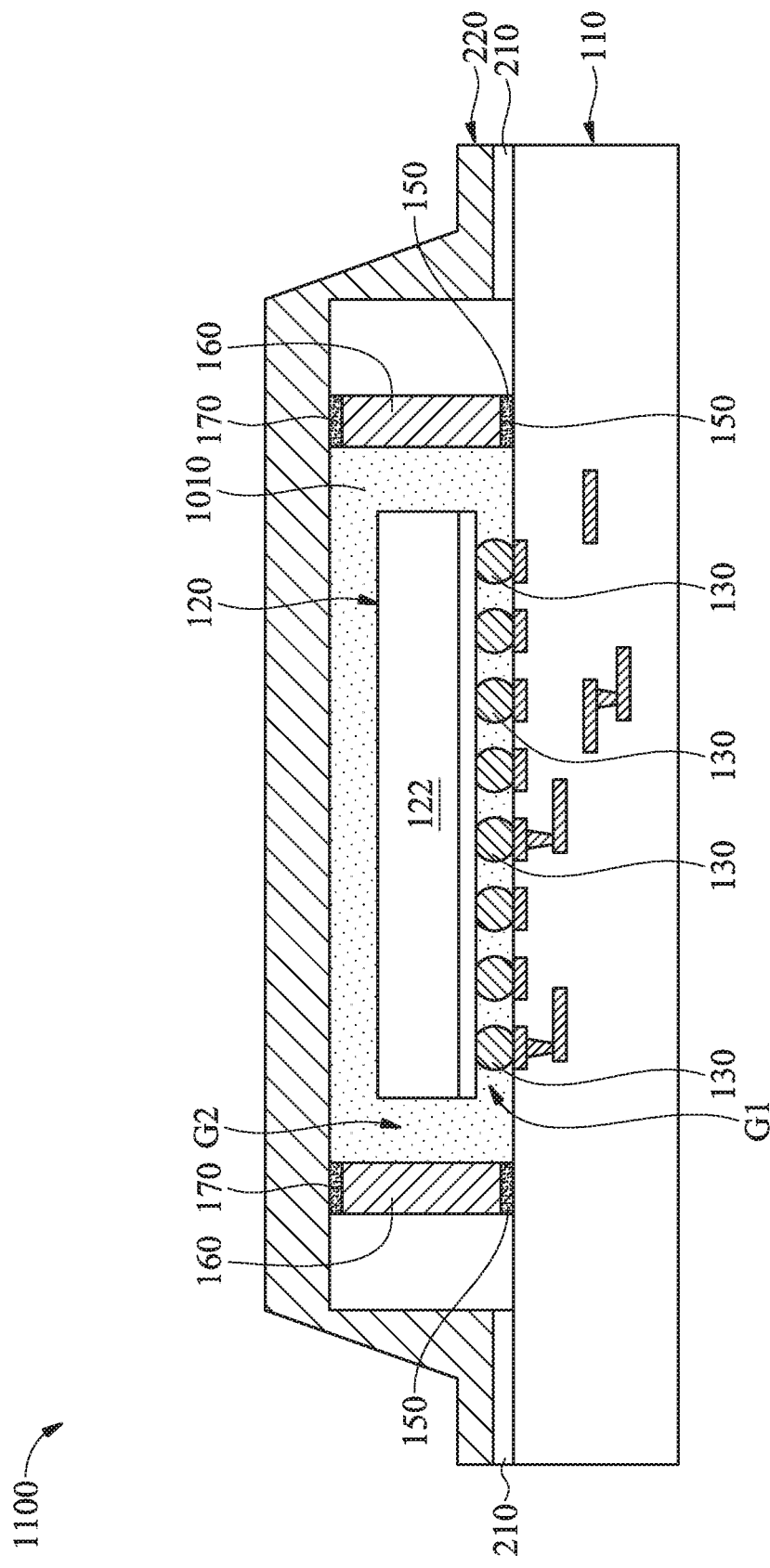
FIG. 11 is a cross-sectional view of a chip package structure, in accordance with some embodiments.

FIG. 11 is a cross-sectional view of a chip package structure 1100, in accordance with some embodiments. As shown in FIG. 11, the chip package structure 1100 is similar to the chip package structure 1000 of FIG. 10, except that the heat conductive layer 1010 of the chip package structure 1100 further extends into the gap G1 between the chip 120 and the substrate 110, in accordance with some embodiments.

The heat conductive layer 1010 surrounds the bumps 130, in accordance with some embodiments. In the chip package structure 1100, an underfill layer is not formed, in accordance with some embodiments.

Figure 12:
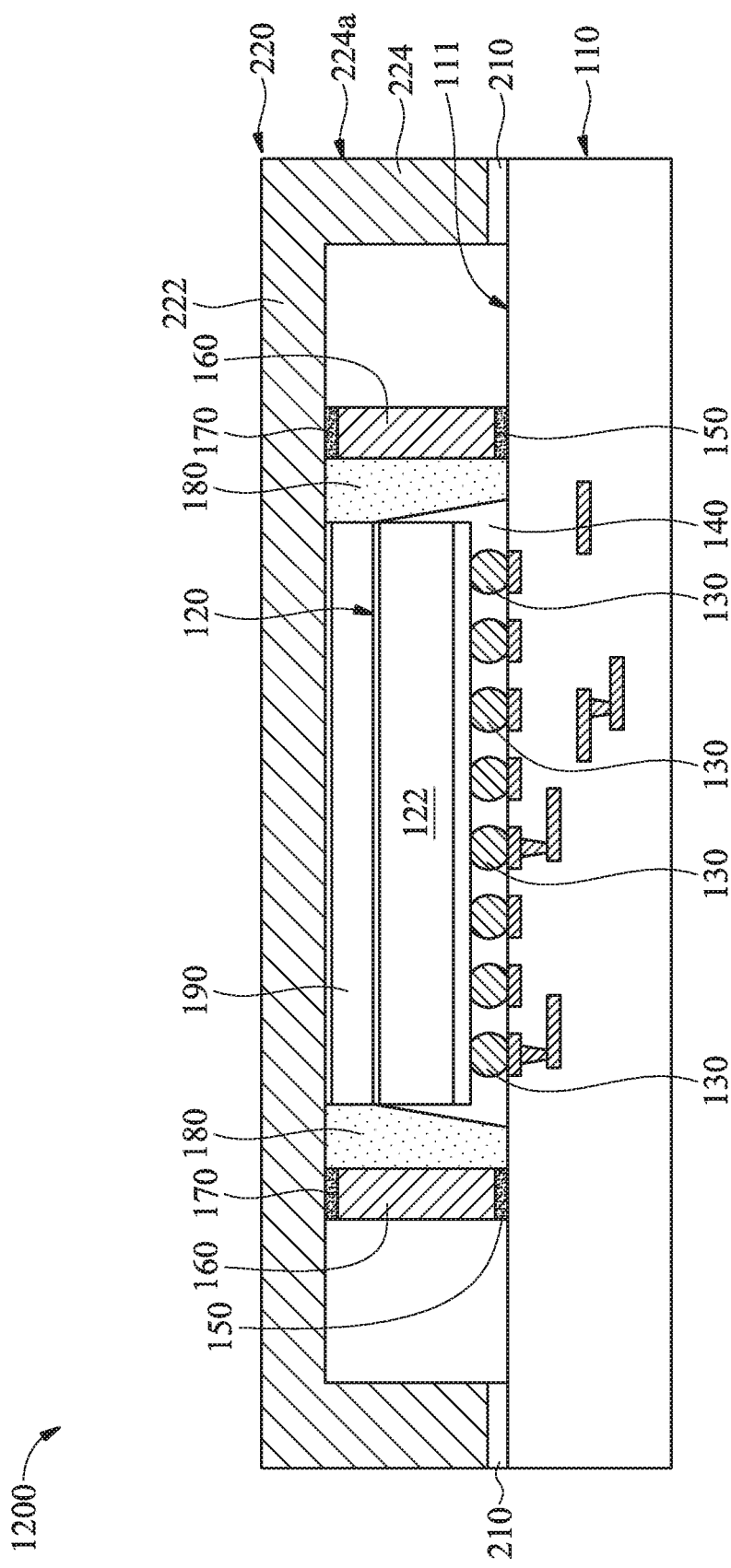
FIG. 12 is a cross-sectional view of a chip package structure, in accordance with some embodiments.

FIG. 12 is a cross-sectional view of a chip package structure 1200, in accordance with some embodiments. As shown in FIG. 12, the chip package structure 1200 is similar to the chip package structure 100 of FIG. 1E, except that the heat-spreading lid 220 does not have the brim portion 226, in accordance with some embodiments.

The lid sidewall structure 224 is bonded to the adhesive layer 210, in accordance with some embodiments. The lid sidewall structure 224 has an outer sidewall 224a substantially vertical to a top surface 111 of the substrate 110, in accordance with some embodiments.

Processes and materials for forming the chip package structures 200, 300, 400, 500, 600, 700, 800, 900, 1000, 1100, and 1200 may be similar to, or the same as, those for forming the chip package structure 100 described above, in accordance with some embodiments.

In accordance with some embodiments, chip package structures and methods for forming the same are provided. The methods (for forming the chip package structures) form a heat-spreading wall structure adjacent to a chip and connected to a heat-spreading lid thereover and form a heat conductive layer between the chip and the heat-spreading wall structure. The heat-spreading wall structure and the heat conductive layer conduct the heat from a sidewall of the chip to the heat-spreading lid. Therefore, the heat dissipation efficiency of the chip package structure is improved. As a result, the reliability of the chip package structure is improved.

In accordance with some embodiments, a method for forming a chip package structure is provided. The method includes disposing a chip over a substrate. The method includes forming a heat-spreading wall structure over the substrate. The heat-spreading wall structure is adjacent to the chip, and there is a first gap between the chip and the heat-spreading wall structure. The method includes forming a first heat conductive layer in the first gap. The method includes forming a second heat conductive layer over the chip. The method includes disposing a heat-spreading lid over the substrate to cover the heat-spreading wall structure, the first heat conductive layer, the second heat conductive layer, and the chip. The heat-spreading lid is bonded to the substrate, the heat-spreading wall structure, the first heat conductive layer, and the second heat conductive layer.

In accordance with some embodiments, a method for forming a chip package structure is provided. The method includes bonding a chip to a substrate. The method includes forming a heat-spreading wall structure over the substrate. The method includes forming a heat conductive layer over the chip and between the chip and the heat-spreading wall structure. The method includes bonding a heat-spreading lid to the substrate, the heat-spreading wall structure, and the heat conductive layer.

In accordance with some embodiments, a chip package structure is provided. The chip package structure includes a substrate. The chip package structure includes a chip over the substrate. The chip package structure includes a heat-spreading wall structure over the substrate and spaced apart from the chip. The chip package structure includes a first heat conductive layer between the heat-spreading wall structure and the chip. The chip package structure includes a second heat conductive layer over the chip. The chip package structure includes a heat-spreading lid over the substrate and covering the heat-spreading wall structure, the first heat conductive layer, the second heat conductive layer, and the chip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a chip package structure, comprising:
    disposing a chip over a substrate;
    forming a heat-spreading wall structure over the substrate, wherein the heat-spreading wall structure is adjacent to the chip, and there is a first gap between the chip and the heat-spreading wall structure;
    forming a first heat conductive layer in the first gap, wherein the first heat conductive layer has a recess over a top surface of the chip;
    after forming the first heat conductive layer in the first gap, forming a second heat conductive layer in the recess of the first heat conductive layer and over the top surface of the chip; and
    disposing a heat-spreading lid over the substrate to cover the heat-spreading wall structure, the first heat conductive layer, the second heat conductive layer, and the chip, wherein the heat-spreading lid is bonded to the substrate, the heat-spreading wall structure, the first heat conductive layer, and the second heat conductive layer.

2. The method for forming the chip package structure as claimed in claim 1, wherein the first heat conductive layer is in direct contact with the heat-spreading lid, the second heat conductive layer, the heat-spreading wall structure, and the substrate after disposing the heat-spreading lid over the substrate.

3. The method for forming the chip package structure as claimed in claim 1, wherein the second heat conductive layer is in direct contact with the heat-spreading lid, the first heat conductive layer, and the chip.

4. The method for forming the chip package structure as claimed in claim 1, wherein a first thermal conductivity of the second heat conductive layer is greater than a second thermal conductivity of the first heat conductive layer, and the second thermal conductivity is greater than a third thermal conductivity of air.

5. The method for forming the chip package structure as claimed in claim 1, wherein the heat-spreading wall structure has a sidewall facing the chip, the sidewall has a recess, and the recess is filled with the first heat conductive layer.

6. The method for forming the chip package structure as claimed in claim 1, wherein the chip is bonded to the substrate through a bump, there is a second gap between the chip and the substrate, the bump is in the second gap, and the method further comprises:
    forming an underfill layer in the second gap before forming the heat-spreading wall structure over the substrate, wherein the underfill layer surrounds the bump.

7. The method for forming the chip package structure as claimed in claim 6, wherein the first heat conductive layer is in direct contact with the underfill layer.

8. The method for forming the chip package structure as claimed in claim 1, wherein the forming of the heat-spreading wall structure over the substrate comprises:
    bonding the heat-spreading wall structure to the substrate through an adhesive layer.

9. The method for forming the chip package structure as claimed in claim 1, wherein the first heat conductive layer is softer than the second heat conductive layer.

10. The method for forming the chip package structure as claimed in claim 1, wherein the first heat conductive layer surrounds the chip, and the heat-spreading wall structure surrounds the first heat conductive layer.

11. A method for forming a chip package structure, comprising:
    bonding a chip to a substrate;
    forming a heat-spreading wall structure over the substrate;
    forming a first heat conductive layer between the chip and the heat-spreading wall structure, wherein the first heat conductive layer has a lower portion and an upper portion, and the lower portion is narrower than the upper portion;
    after forming the first heat conductive layer between the chip and the heat-spreading wall structure, forming a second heat conductive layer over the chip and surrounded by the first heat conductive layer, wherein a first thermal conductivity of the second heat conductive layer is greater than a second thermal conductivity of the first heat conductive layer; and
    bonding a heat-spreading lid to the substrate, the heat-spreading wall structure, the second heat conductive layer, and the upper portion of the first heat conductive layer, wherein the heat-spreading lid comprises a top plate and a lid sidewall structure, the lid sidewall structure is under and connected to the top plate, the heat-spreading wall structure is between the chip and the lid sidewall structure, and a bottom surface of the top plate is in direct contact with a top surface of the first heat conductive layer.

12. The method for forming the chip package structure as claimed in claim 11, wherein a first distance between the chip and the heat-spreading wall structure is less than a second distance between the heat-spreading wall structure and the lid sidewall structure.

13. The method for forming the chip package structure as claimed in claim 11, further comprising:
    forming an underfill layer between the chip and the substrate before forming the heat-spreading wall structure over the substrate, wherein the first heat conductive layer is in direct contact with the underfill layer.

14. The method for forming the chip package structure as claimed in claim 11, wherein a width of the lower portion of the first heat conductive layer continuously decreases toward the substrate.

15. The method for forming the chip package structure as claimed in claim 11, wherein the first heat conductive layer is softer than the second heat conductive layer.

16. A method for forming a chip package structure, comprising:
    bonding a chip to a substrate;
    forming a heat-spreading wall structure over the substrate;
    forming a first heat conductive layer between the chip and the heat-spreading wall structure, wherein the first heat conductive layer has an opening exposing a top surface of the chip;

after forming the first heat conductive layer between the chip and the heat-spreading wall structure, forming a second heat conductive layer in the opening of the first heat conductive layer and over the top surface of the chip, wherein an upper portion of the first heat conductive layer is between the second heat conductive layer and the heat-spreading wall structure; and bonding a heat-spreading lid to the substrate, the heat-spreading wall structure, the first heat conductive layer, and the second heat conductive layer.

17. The method for forming the chip package structure as claimed in claim 16, further comprising:

forming an adhesive layer over the heat-spreading wall structure before forming the first heat conductive layer between the chip and the heat-spreading wall structure, wherein the first heat conductive layer is partially between the adhesive layer and the second heat conductive layer.

18. The method for forming the chip package structure as claimed in claim 17, wherein the adhesive layer is in direct contact with the heat-spreading wall structure, the heat-spreading lid, and the first heat conductive layer.

19. The method for forming the chip package structure as claimed in claim 16, further comprising:

forming an adhesive layer over the substrate before forming the heat-spreading wall structure over the substrate, wherein the heat-spreading wall structure is formed over the adhesive layer, and a lower portion of the first heat conductive layer is adjacent to the adhesive layer.

20. The method for forming the chip package structure as claimed in claim 19, wherein the lower portion of the first heat conductive layer is in direct contact with the adhesive layer and the substrate.

\* \* \* \* \*